US010541035B1

(12) United States Patent
Lu et al.

(10) Patent No.: US 10,541,035 B1
(45) Date of Patent: Jan. 21, 2020

(54) READ BIAS ADJUSTMENT FOR COMPENSATING THRESHOLD VOLTAGE SHIFT DUE TO LATERAL CHARGE MOVEMENT

(71) Applicant: SanDisk Technologies LLC, Addison, TX (US)

(72) Inventors: Ching-Huang Lu, Fremont, CA (US); Han-Ping Chen, Santa Clara, CA (US); Chung-Yao Pai, San Jose, CA (US); Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/022,373

(22) Filed: Jun. 28, 2018

(51) Int. Cl.
*G11C 16/04* (2006.01)
*G11C 16/26* (2006.01)
*G11C 11/56* (2006.01)
*G11C 16/34* (2006.01)

(52) U.S. Cl.
CPC .......... *G11C 16/26* (2013.01); *G11C 11/5671* (2013.01); *G11C 16/0483* (2013.01); *G11C 16/3427* (2013.01)

(58) Field of Classification Search
CPC . G11C 16/26; G11C 16/0483; G11C 11/5671; G11C 16/3427
USPC .................................................... 365/185.02
See application file for complete search history.

(56) References Cited

U.S. PATENT DOCUMENTS

| 8,051,240 | B2 | 11/2011 | Dutta et al. | |
|---|---|---|---|---|
| 8,472,266 | B2* | 6/2013 | Khandelwal | G11C 16/26 |
| | | | | 365/189.15 |
| 8,582,365 | B2* | 11/2013 | Kim | G11C 11/5642 |
| | | | | 365/185.18 |
| 8,611,148 | B2 | 12/2013 | Dutta et al. | |
| 9,183,944 | B2* | 11/2015 | Kim | G11C 16/3427 |
| 9,336,891 | B2 | 5/2016 | Yuan et al. | |
| 9,349,478 | B2 | 5/2016 | Yuan et al. | |
| 9,721,652 | B2 | 8/2017 | Puthenthermadam et al. | |
| 9,805,809 | B1 | 10/2017 | Zhou et al. | |
| 2015/0071008 | A1* | 3/2015 | Yang | G11C 16/26 |
| | | | | 365/185.23 |
| 2016/0071595 | A1 | 3/2016 | Dong et al. | |
| 2017/0140814 | A1* | 5/2017 | Puthenthermadam | |
| | | | | G11C 16/3427 |

* cited by examiner

*Primary Examiner* — Tha-O H Bui
(74) *Attorney, Agent, or Firm* — Vierra Magen Marcus LLP

(57) ABSTRACT

Apparatuses and techniques are provided for accurately reading memory cells by compensating for lateral charge diffusion between adjacent memory cells. A selected memory cell is read with a compensation which is based on classifying the threshold voltages of adjacent memory cells into bins. In one aspect, the compensation is based on the level of the current control gate voltage of the selected word line. In another aspect, the classifying of the threshold voltages of the adjacent memory cells can be a function of temperature. In another aspect, a memory cell can be read with compensation after a previous read operation without compensation results in an uncorrectable error. In another aspect, the classifying uses more bins for a selected edge word line.

20 Claims, 24 Drawing Sheets

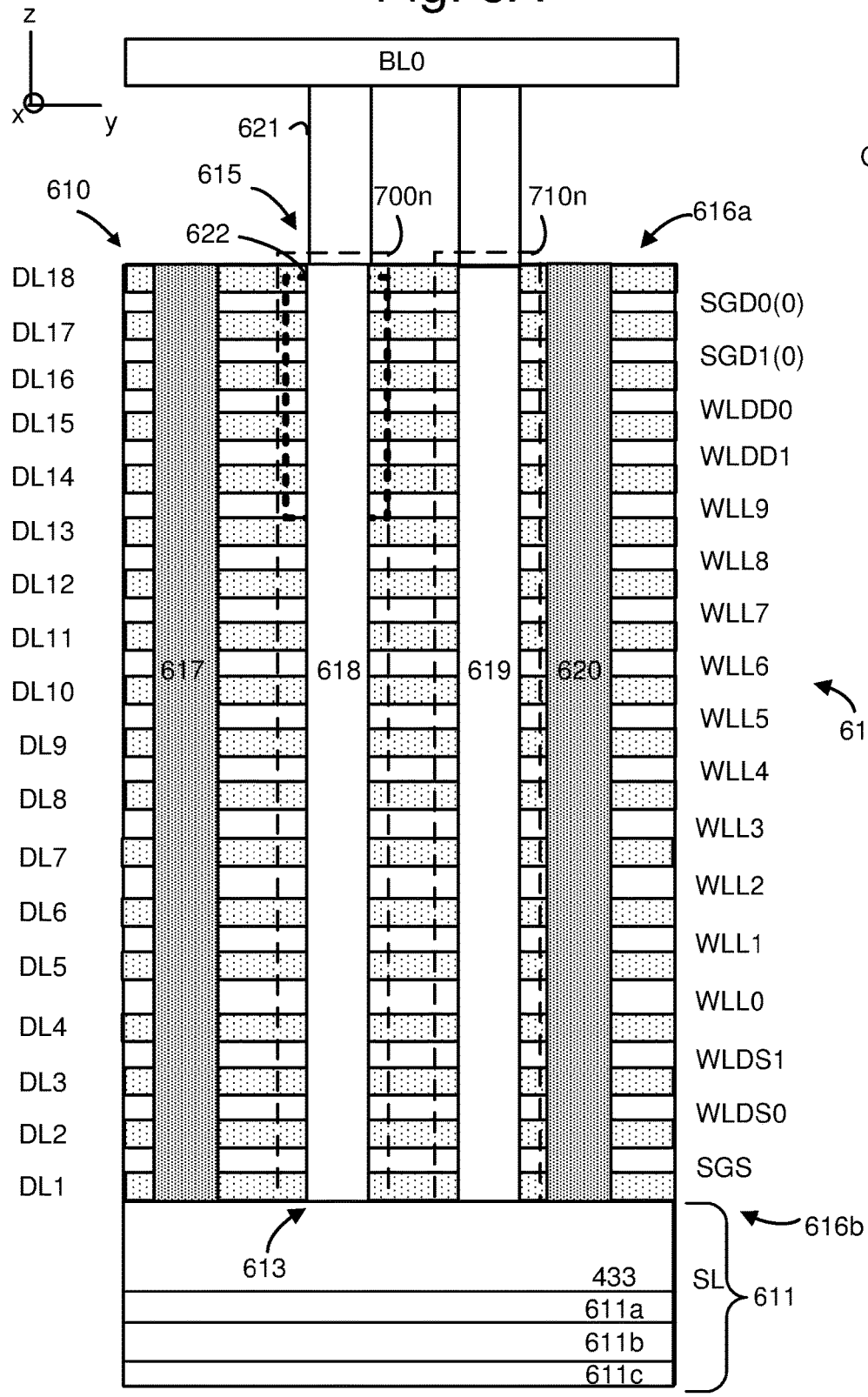

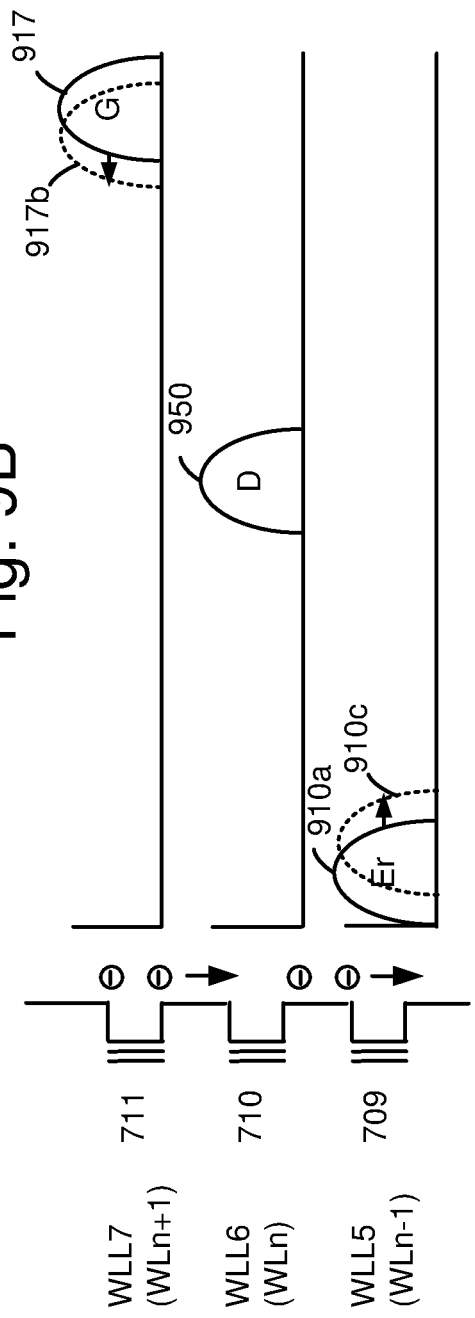

Fig. 11A

Identify Vth of adjacent memory cells of a selected memory cell in each NAND string of a set of NAND strings, 1100

↓

Read each selected memory cell with compensation based on the Vth of the adjacent memory cells, 1101

Fig. 11B

Read command received for a selected non-edge word line, WLn, 1110

↓

Read memory cells of WLn-1 and WLn+1 to classify their Vth into bins; store a respective bin combination for each selected memory cell in respective latches, 1111

↓

Read the selected memory cells of WLn repeatedly with compensation on WLn-1, WLn+1 and/or WLn for each bin combination, 1112

↓

Select a read result for each selected memory cell based on the respective bin combination, 1113

Fig. 11C

Read command received for a selected edge word line, WLn, 1120

↓

Read memory cells of one adjacent data word line to classify their Vth into bins; store a respective bin combination for each selected memory cell in respective latches, 1121

↓

Read the selected memory cells of WLn repeatedly with compensation on the adjacent data word line, an adjacent dummy word line and/or WLn for each bin combination, 1122

↓

Select a read result for each selected memory cell based on the respective bin combination, 1123

Fig. 11D

Read command received for a selected open word line, WLn, 1130

↓

Read memory cells of WLn-1 to classify their Vth into bins; store a respective bin combination for each selected memory cell in respective latches, 1131

↓

Read the selected memory cells of WLn repeatedly with compensation on WLn-1, WLn+1 and/or WLn for each bin combination, 1132

↓

Select a read result for each selected memory cell based on the respective bin combination, 1133

Fig. 12A

Classify WLn-1 and WLn+1 into 2 bins

Comp. on WLn-1 and WLn+1 — Example 1

| WLn-1/WLn+1 | Vread (n-1)/(n+1) | BC |
|---|---|---|
| Low/Low | Low/Low | 1 |
| Low/High | Low/High | 2 |
| High/Low | High/Low | 3 |
| High/High | High/High | 4 |

Example 1a

| WLn-1/WLn+1 | Vread (n-1)/(n+1) | VWLn | BC |
|---|---|---|---|
| Low/Low | Low/Low | low | 1 |
| Low/High | Med./Med. | med.-low | 2 |
| High/Low | Med./Med. | med.-high | 3 |
| High/High | High/High | high | 4 |

Comp. on WLn+1 — Example 2

| WLn-1/WLn+1 | Vread (n-1)/(n+1) | BC |
|---|---|---|
| Low/Low | Nom./Low | 1 |
| Low/High | Nom./Med.-low | 2 |
| High/Low | Nom./Med.-high | 3 |
| High/High | Nom./High | 4 |

Example 2a

| Vread (n-1)/(n+1) | BC |
|---|---|
| Nom./Low | 1 |
| Nom./Med. | 2 |
| Nom./Med. | 2 |
| Nom./High | 3 |

Comp. on WLn — Example 3

| WLn-1/WLn+1 | Vread (n-1)/(n+1) | VWLn | BC |
|---|---|---|---|
| Low/Low | Nom./Nom. | low | 1 |
| Low/High | Nom./Nom. | med.-low | 2 |
| High/Low | Nom./Nom. | med.-high | 3 |
| High/High | Nom./Nom. | high | 4 |

Example 3a

| VWLn | BC |
|---|---|
| low | 1 |
| med. | 2 |
| med. | 2 |
| high | 3 |

Fig. 12B

Classify WLn-1 into 2 bins and WLn+1 into 3 bins

Comp. on WLn-1 and WLn+1 — Example 4

| WLn-1/WLn+1 | Vread (n-1)/(n+1) | BC |
|---|---|---|
| Low/Low | Low/Low | 1 |
| Low/Med. | Low/Med. | 2 |
| Low/High | Low/High | 3 |
| High/Low | High/Low | 4 |
| High/Med. | High/Med. | 5 |
| High/High | High/High | 6 |

Example 4a

| Vread (n-1)/(n+1) | BC |
|---|---|
| Low/Low | 1 |
| Low/Med. | 2 |
| Med./Med. | 3 |
| Med./Med. | 3 |
| High/Med. | 4 |
| High/High | 5 |

Comp. on WLn+1 — Example 5

| WLn-1/WLn+1 | Vread (n-1)/(n+1) | BC |
|---|---|---|
| Low/Low | Nom./Low | 1 |
| Low/Med. | Nom./Med.-Low | 2 |
| Low/High | Nom./Med. | 3 |
| High/Low | Nom./Med. | 3 |
| High/Med. | Nom./Med.-High | 4 |
| High/High | Nom./High | 5 |

Comp. on WLn — Example 6

| Vread (n-1)/(n+1) | VWLn | BC |
|---|---|---|
| Nom./Nom. | low | 1 |
| Nom./Nom. | med.-low | 2 |
| Nom./Nom. | med. | 3 |
| Nom./Nom. | med. | 3 |
| Nom./Nom. | med.-high | 4 |
| Nom./Nom. | high | 5 |

Fig. 12C

Classify WLn-1 into 3 bins and WLn+1 into 3 bins: comp. on WLn-1 and WLn+1

Example 7

| WLn-1/WLn+1 | Vread (n-1)/(n+1) | BC |
|---|---|---|
| Low/Low | Low/Low | 1 |
| Low/Med. | Low/Med. | 2 |
| Low/High | Low/High | 3 |
| Med./Low | Med./Low | 4 |
| Med./Med. | Med./Med. | 5 |
| Med./High | Med./High | 6 |
| High/Low | High/Low | 7 |
| High/Med. | High/Med. | 8 |
| High/High | High/High | 9 |

Example 7a

| | Vread (n-1)/(n+1) | BC |
|---|---|---|
| | Low/Low | 1 |
| | Low/Med. | 2 |
| | Low/High | 3 |
| | Med./Low | 2 |
| | Med./Med. | 4 |
| | Med./High | 5 |
| | Low/High | 3 |
| | Med./High | 5 |
| | High/High | 6 |

Fig. 12D

Bottom edge WL: classify WLn+1 into 2 bins: comp. on WLn+1

Example 8

| WLn+1 | Vread (n-1)/(n+1) | BC |
|---|---|---|
| Low | Nom./Low | 1 |
| High | Nom./High | 2 |

Top edge or open WL: classify WLn-1 into 2 bins: comp. on WLn-1

Example 9

| WLn-1 | Vread (n-1)/(n+1) | BC |
|---|---|---|
| Low | Low/Nom. | 1 |
| High | High/Nom. | 2 |

Fig. 12E

Bottom edge WL: classify WLn+1 into 3 bins: comp. on WLn+1

Example 10

| WLn+1 | Vread (n-1)/(n+1) | BC |
|---|---|---|
| Low | Nom./Low | 1 |
| Med. | Nom./Med. | 2 |
| High | Nom./High | 3 |

Top edge or open WL: classify WLn-1 into 3 bins: comp. on WLn-1

Example 11

| WLn-1 | Vread (n-1)/(n+1) | BC |
|---|---|---|
| Low | Low/Nom. | 1 |
| Med. | Med./Nom. | 2 |
| High | High/Nom. | 3 |

Fig. 12F

Classify WLn-1 and WLn+1 into 2 bins with one read

_Comp. on WLn-1 and WLn+1_
Example 12

| WLn-1 /WLn+1 | Vread (n-1)/(n+1) | BC |
|---|---|---|
| Low/Low | Low/Low | 1 |
| Low/high, high/low or high/high | High/High | 2 |

_Comp. on WLn+1_
Example 13

| WLn-1 /WLn+1 | Vread (n-1)/(n+1) | BC |
|---|---|---|
| Low/Low | Low/Nom. | 1 |
| Low/high, high/low or high/high | High/Nom. | 2 |

_Comp. on WLn_
Example 14

| WLn-1 /WLn+1 | Vread (n-1)/(n+1) | VWLn | BC |
|---|---|---|---|
| Low/Low | Nom./Nom. | low | 1 |
| Low/high, high/low or high/high | Nom./Nom. | Med. | 2 |

READ BIAS ADJUSTMENT FOR COMPENSATING THRESHOLD VOLTAGE SHIFT DUE TO LATERAL CHARGE MOVEMENT

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 5A depicts an example cross-sectional view of a portion of BLK0 of FIG. 4.

FIG. 5B depicts an example transistor 650.

FIG. 9B depicts memory cells in the NAND string 700n of FIG. 7 and another example of shifts in their Vth distributions based on the Vth of adjacent memory cells.

FIG. 11A depicts a process for reading a selected memory cell with compensation based on the threshold voltage (Vth) of adjacent memory cells.

FIG. 11B depicts an example process consistent with FIG. 11A for reading memory cells of a selected non-edge word line while compensating for the threshold voltages of adjacent memory cells.

FIG. 11C depicts an example process consistent with FIG. 11A for reading memory cells of a selected edge word line while compensating for the threshold voltages of adjacent memory cells.

FIG. 11D depicts an example process consistent with FIG. 11A for reading memory cells of a selected open word line while compensating for the threshold voltages of adjacent memory cells.

FIG. 12A depicts examples of classifying the Vth of memory cells on WLn−1 and WLn+1 into two bins, in example implementations of FIG. 11B.

FIG. 12B depicts examples of classifying the Vth of memory cells on WLn−1 into two bins, and classifying the memory cells on WLn+1 into three bins, in example implementations of FIG. 11B.

FIG. 12C depicts examples of classifying the Vth of memory cells on WLn−1 into three bins and classifying the Vth of memory cells on WLn+1 into three bins, in example implementations of FIG. 11B.

FIG. 12D depicts examples of classifying the Vth of memory cells on WLn+1 into two bins for a bottom edge word line, and classifying the Vth of memory cells on WLn−1 into two bins for a top edge word line or an open word line, in example implementations of FIGS. 11C and 11D.

FIG. 12E depicts examples of classifying the Vth of memory cells on WLn+1 into three bins for a bottom edge word line, and classifying the Vth of memory cells on WLn−1 into three bins for a top edge word line or an open word line, in example implementations of FIGS. 11C and 11D.

FIG. 12F depicts examples of classifying the Vth of memory cells on WLn−1 into two bins and classifying the Vth of memory cells on WLn+1 into two bins, using one read operation, in example implementations of FIG. 11B.

DETAILED DESCRIPTION

Apparatuses and techniques are described for accurately reading memory cells.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. Each NAND string may comprise a channel material and a charge trapping material which extend continuously in the NAND string. A different portion of the charge trapping material is associated with each memory cell and may store charges which represent a data state.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

Figure 10:
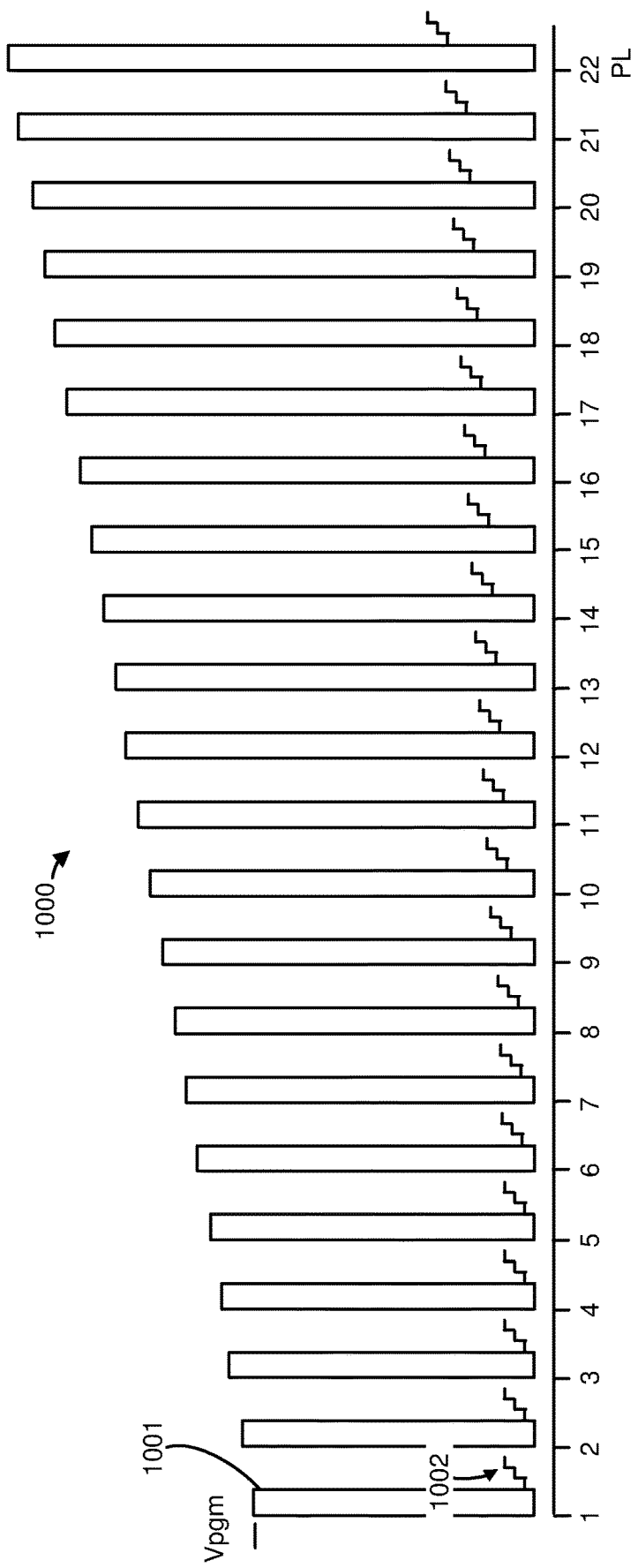
FIG. 10 depicts a voltage signal used in a series of program loops in an example program operation for MLC memory cells which results in the Vth distribution of FIG. 8.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 10. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command. Based on its data state, a memory cell will either remain in the erased state or be programmed to a programmed data state. For example, in a one bit per cell memory device, also referred to as SLC, or single level cell, there are two data states including the erased state and the programmed state. MLC or multi-level cells store two or more bits per cell. For example, in a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 8). In a four-bit per cell memory device, there are sixteen data states including the erased state (S0) and fifteen higher data states (S0-S15).

After the memory cells are programmed, the data can be read back in a read operation. A read operation can involve applying one read voltage, or a series of read voltages, to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltages of adjacent data states. During the read operation, the voltages of the unselected word lines are ramped up to a read pass voltage which is high enough to place the unselected memory cells in a strongly conductive state, to avoid interfering with the sensing of the selected memory cells.

However, the Vth of a memory call can shift after the memory cell is programmed due to an electric field between the memory cell and the adjacent memory cells in a NAND string. The Vth of a set of memory calls can also therefore shift and widen. In particular, a lateral charge movement or diffusion may occur in the charge trapping material, in which electrons move away from a given memory cell to an adjacent memory cell if the adjacent memory cell has a lower Vth than the given memory cell. Or, electrons move toward a given memory cell from an adjacent memory cell if the adjacent memory cell has a higher Vth than the given memory cell. Each memory cell can therefore experience a charge gain or loss based on the Vth and data state of the adjacent memory cells. The problem of lateral charge movement is expected to worsen as memory device dimensions become smaller.

Techniques provided herein address the above and other issues. In one aspect, a read operation for a selected memory cell involves reading the adjacent memory cells and classifying their Vth into bins or ranges of Vth. The selected memory cell is then read with compensation which is based on the Vth of the adjacent memory cells. The compensation can be provided by adjusting read pass voltages on one or both adjacent word lines, and/or by adjusting the control gate read voltage on the selected word line, while the selected memory cell is read. A memory cell is read multiple times and one read result is selected based on the Vth of the adjacent memory cells.

In another aspect, the compensation is also based on the level of the current control gate voltage of the selected word line. For example, the read pass voltages on the adjacent word lines can be set based on a decreasing function of the control gate voltages.

In another aspect, the classifying of the Vth of the adjacent memory cells can be more detailed or granular, e.g., by classifying of the Vth into a larger number of bins, where each bin is smaller in its voltage range, when the temperature is higher, to account for a greater likelihood of inter-cell charge diffusion.

In another aspect, a memory cell can be read with compensation after a previous read operation without compensation results in an uncorrectable error.

In another aspect, a memory cell can be read with compensation based on the Vth of both adjacent memory cells after a previous read operation with compensation for the Vth of only one adjacent memory cell results in an uncorrectable error.

In another aspect, when a selected memory cell is an edge or open memory cell, e.g., a memory cell connected to an edge or open word line, respectively, the Vth of one adjacent memory cell can be determined with more detail than when the selected memory cell is not an edge or open memory cell. The latches which are available to store data from classifying a Vth can be dedicated to the one adjacent memory cell, where the other adjacent memory cell has a predetermined Vth and does not have to be read to be classified or compensated. The Vth of the one adjacent memory cell can be classified into a greater number of bins when the selected memory cell is an edge or open memory cell, compared to when the selected memory cell is not an edge or open memory cell. This allows the latches to be used efficiently.

These and other features are discussed further below.

Figure 1A:
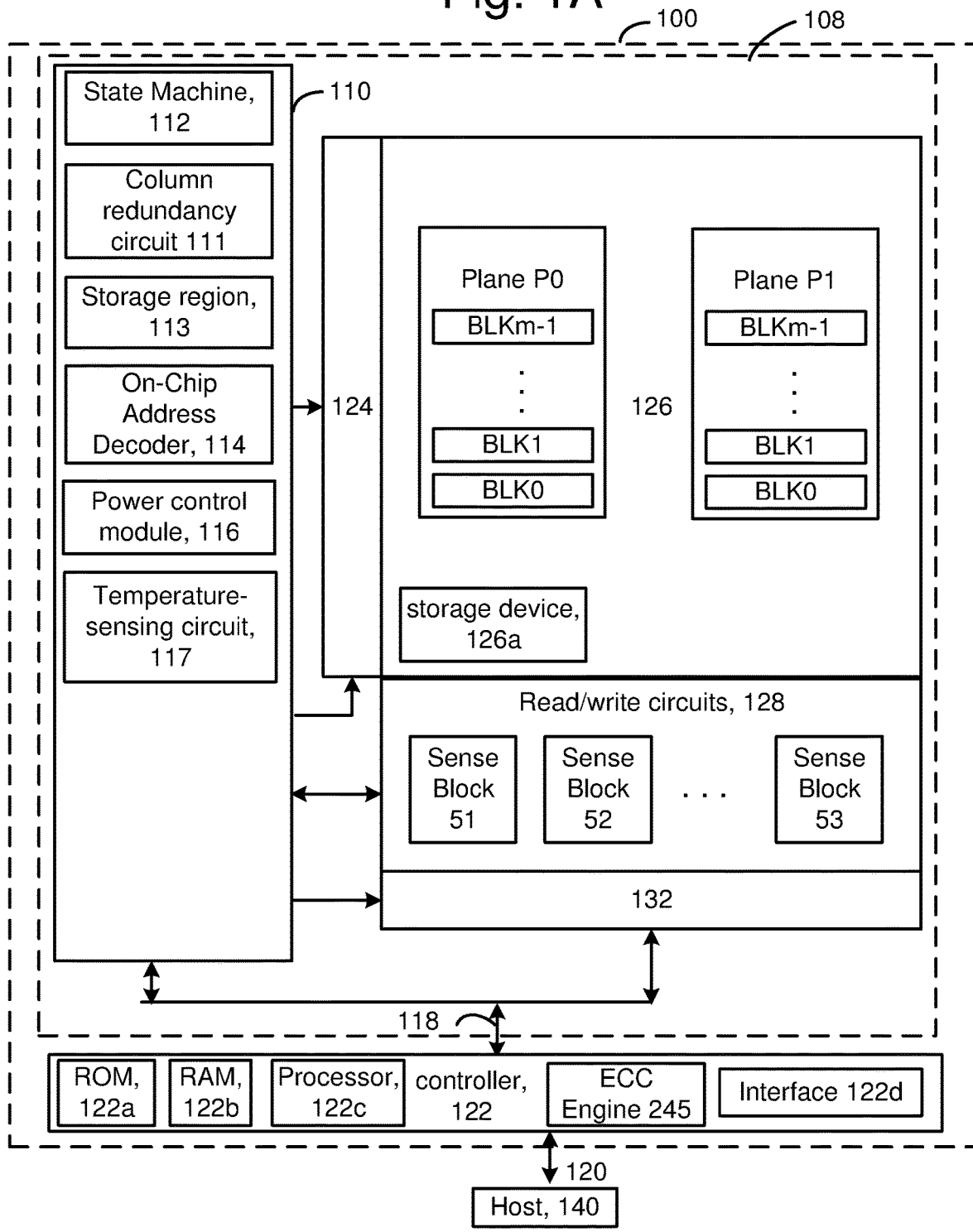
FIG. 1A is a block diagram of an example memory device.

FIG. 1A is a block diagram of an example memory device. The memory device 100, such as a non-volatile storage system, may include one or more memory die 108, also referred to as a chip or integrated circuit. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. In one embodiment, the memory structure comprise blocks of memory cells arranged in one or more planes. For example, blocks BLK0-BLKm−1 are arranged in each of planes P0 and P1. A plane may be an area of a substrate with a diffusion layer (such as the well region 433 in FIG. 3) which is common to each block in the plane, in one approach. The blocks in a plane typically share a common set of bit lines.

The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Figure 1B:
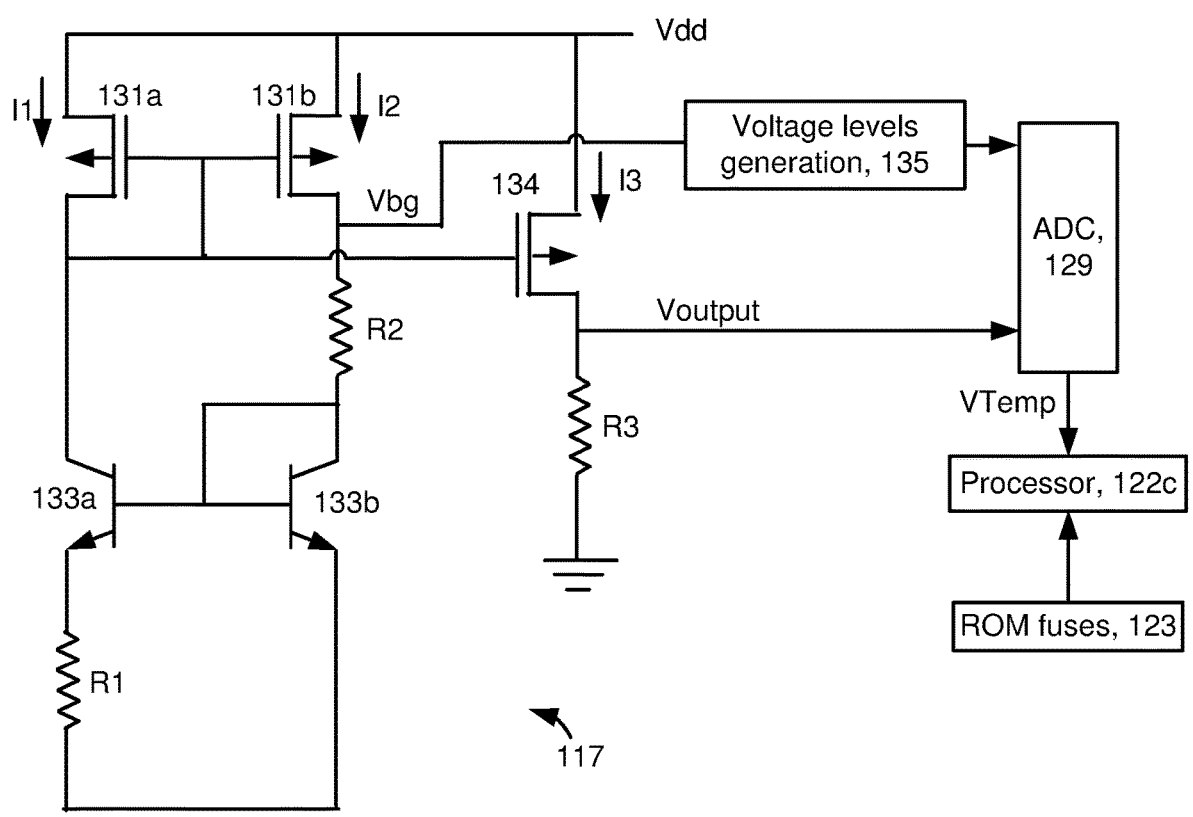
FIG. 1B depicts an example of the temperature-sensing circuit 117 of FIG. 1A.

The control circuitry 110 cooperates with the read/write circuits 128 to perform memory operations on the memory structure 126, and includes a state machine 112, a column redundancy circuit 111, an on-chip address decoder 114, a power control module 116 (power control circuit), and a temperature-sensing circuit 117 (see FIG. 1B). The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The column redundancy circuit provides a mapping between spare NAND strings which replace defective primary NAND strings. The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, temperature-sensing circuit 117, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors and determine whether an uncorrectable error exists when reading a set of memory cells, such as for use in the processes of FIGS. 11E and 11F.

The controller 122 or control circuitry 110 can be configured with hardware, firmware and/or software for implementing the processes described herein, including the processes of the flowcharts of FIG. 11A-11F.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 117 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122c. This is data indicating a temperature of the memory device, and may be used by the power control module 116, for example, to adjust word line voltages during a read operation as described herein. ROM fuses 123 store data which correlates the matching voltage level to a temperature, in one approach.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Figure 2:
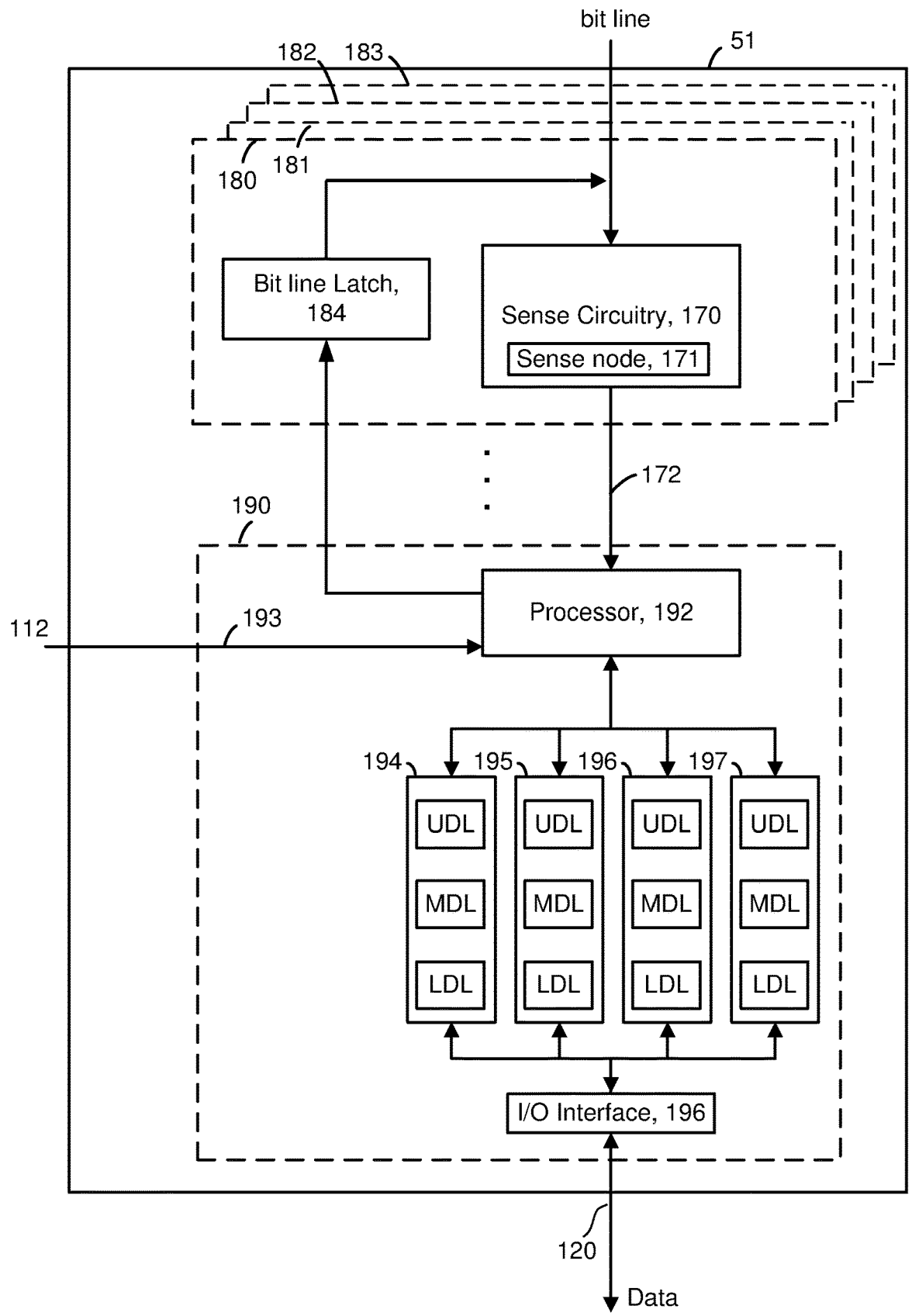
FIG. 2 is a block diagram depicting one embodiment of the sense block 51 of FIG. 1A.

FIG. 2 is a block diagram depicting one embodiment of the sense block 51 of FIG. 1A. An individual sense block 51 is partitioned into one or more core portions, referred to as sense circuits 180-183 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements.

The sense circuit 180, as an example, comprises sense circuitry 170 that performs sensing by determining whether a conduction current in a connected bit line is above or below a predetermined threshold level. The sense circuitry may include a sense node 171 which is charged up during sensing. An amount of decay of the sense node is used to determine whether a memory cell is in a conductive or non-conductive state. Sense circuit 180 also includes a bit line latch 184 that is used to set a voltage condition on the connected bit line. For example, a predetermined state latched in the bit line latch will result in the connected bit line being pulled to a state designating program inhibit (e.g., 1.5-3 V). As an example, a flag=0 can inhibit programming, while flag=1 does not inhibit programming.

Figure 13:
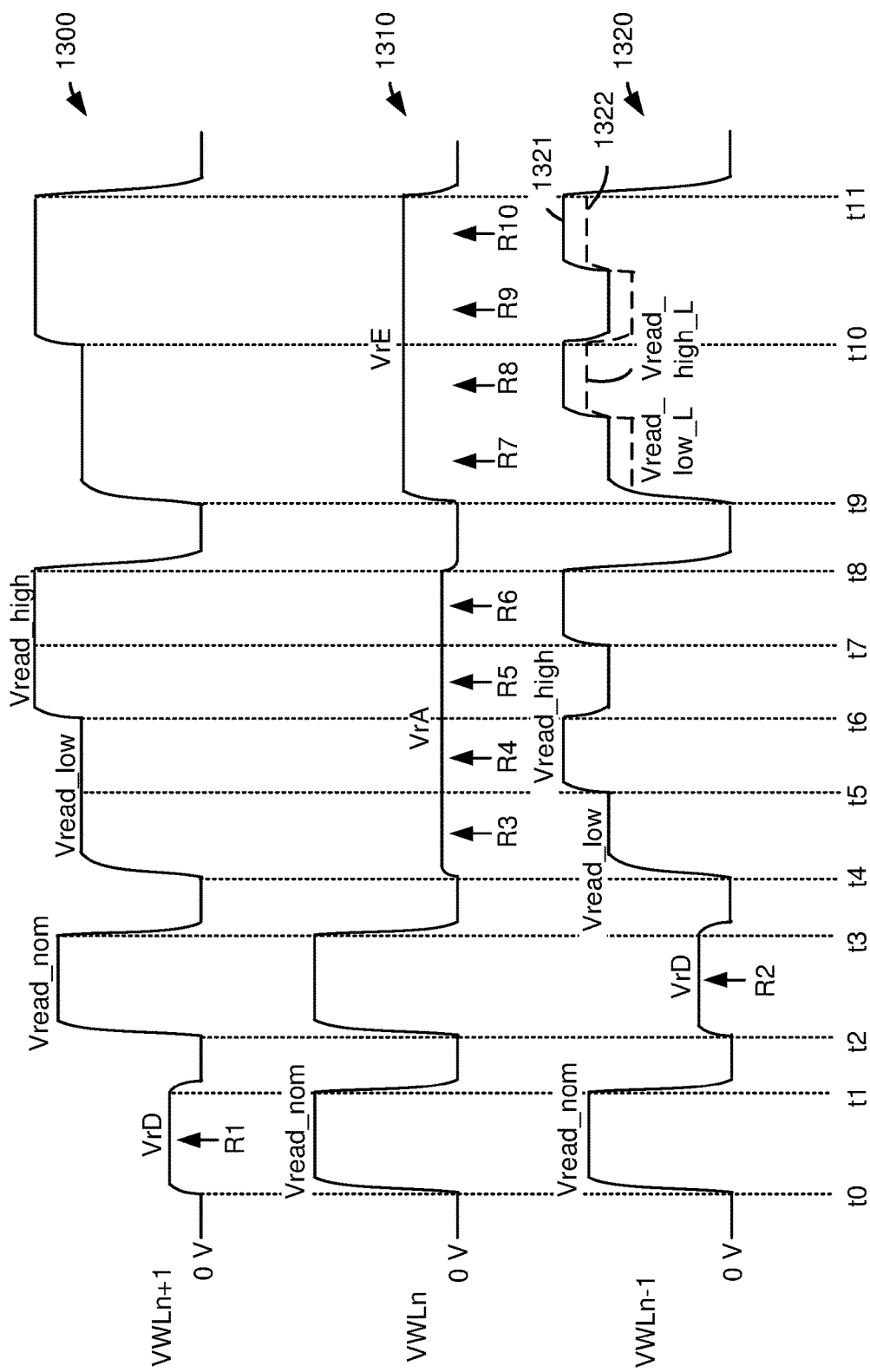
FIG. 13 depicts example word line voltages in an implementation of Example 1 of FIG. 12A.

For example, the sensing can be performed for each of the read processes R1-R10 in FIG. 13.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a lower page of data, and UDL stores a bit for an upper page of data. This is in an eight-level or three-bits per storage element memory device. One additional data latch per bit line can be provided for each additional data bit per storage element.

The processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense circuit 180 may trip at one of these voltages and a corresponding output will be provided from sense circuit 180 to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197. In another embodiment of the managing circuit 190, bit line latch serves double duty, both as a latch for latching the output of the sense circuit 180 and also as a bit line latch as described above.

During a read operation of a set of memory cells comprising a selected memory cell of a NAND string, the sets of latches may be used to store data which classifies the Vth of the adjacent memory cells of the selected memory cell into bins as discussed herein. A bin refers, e.g., to a range of Vth values.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per storage element implementation.

The program operation, under the control of the state machine, comprises a series of programming voltage pulses applied to the control gates of the addressed storage elements. Each program voltage is followed by a read back (verify) to determine if the storage element has been programmed to the desired memory state. In some cases, processor 192 monitors the read back memory state relative to the desired memory state. When the two are in agreement, the processor 192 sets the bit line latch so as to cause the bit line to be pulled to a state designating program inhibit. This inhibits the storage element coupled to the bit line from further programming even if program pulses appear on its control gate. In other embodiments the processor initially loads the bit line latch and the sense circuitry sets it to an inhibit value during the verify process.

Each set of data latches 194-197 may be implemented as a stack of data latches for each sense circuit. In one embodiment, there are three data latches per sense circuit 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated storage element has reached certain mileposts in a program operations. For example, latches may identify that a storage element's Vth is below a particular verify voltage. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A MDL or UDL latch is flipped when a middle or upper page bit, respectively, is stored in an associated storage element. This occurs when an associated storage element completes programming, e.g., when its Vth exceeds a target verify voltage such as VvA-VvG (see FIG. 8).

Figure 3:
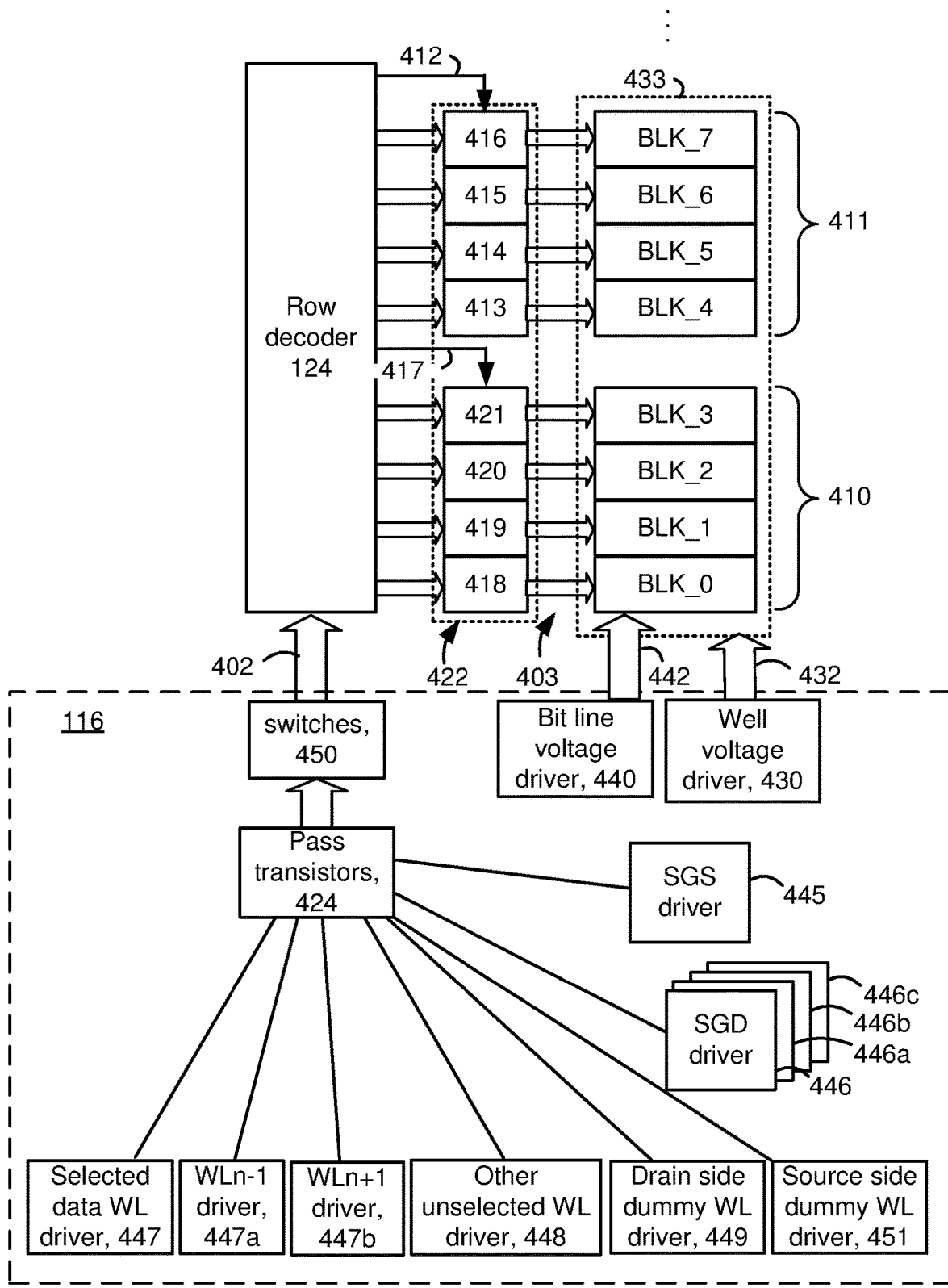
FIG. 3 depicts an example implementation of the power control module 116 of FIG. 1A for providing voltages to blocks of memory cells.

FIG. 3 depicts an example implementation of the power control module 116 of FIG. 1A for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1A provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447 which provides a voltage on a data word line (WLn) selected during a program or read operation. A WLn-1 word line driver 447a provides a voltage on an unselected word line which is adjacent to and below WLn in a stack, and a WLn+1 word line driver 447b which provides a voltage on an unselected word line which is adjacent to and above WLn in a stack. In a word line programming order of a block, WLn-1 is before WLn and WLn+1 is after WLn. A voltage driver 448 is provided for other unselected data word lines. These can be remaining, unselected data word lines other than the selected word line and the adjacent word lines. A drain-side dummy word line driver 449 provides voltages on drain-side dummy word lines such as WLDD0 and WLDD1, and a source-side dummy word line driver 451 provides voltages on source-side dummy word lines such as WLDS1 and WLDS0.

The voltage drivers can also include separate SGD drivers for each sub-block in a block. For example, SGD drivers 446, 446a, 446b and 446c can be provided for SB0, SB1, SB2 and SB3, respectively, of BLK0 such as in FIGS. 6 and 7. In one option, one SGS driver 445 is common to the different sub-blocks in a block. In another option, separate SGS drivers are provided for each sub-block of a block. Moreover, in some cases, such as a depicted in FIGS. 6 and 7 there can be multiple SGD transistors, multiple SGS transistors, multiple drain side dummy memory cells and/or multiple source side dummy memory cells in each NAND string. To provide the greatest flexibility in programming these memory cells and transistors with program voltages or other word line specific parameters, there can be a separate driver for each select gate transistor and dummy memory cell in a NAND string, in one approach. Or, for simplicity, the multiple SGD transistors may be connected and commonly driven, the multiple SGS transistors may be connected and commonly driven, the multiple drain side dummy memory cells may be connected and commonly driven and the multiple source side dummy memory cells may be connected and commonly driven.

The various components, including the row decoder, may receive commands from a controller such as the state machine 112 or the controller 122 to perform the functions described herein.

In one approach, the well region 433 (see also FIG. 5A) is common to the blocks and may be driven by a voltage driver 430 via a path 432. A set of bit lines 442 is also shared by the blocks. A bit line voltage driver 440 provides voltages to the bit lines. In a stacked memory device such as depicted in FIG. 4 to 8, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach. The vertically extending NAND strings have a floating channel.

Figure 4:
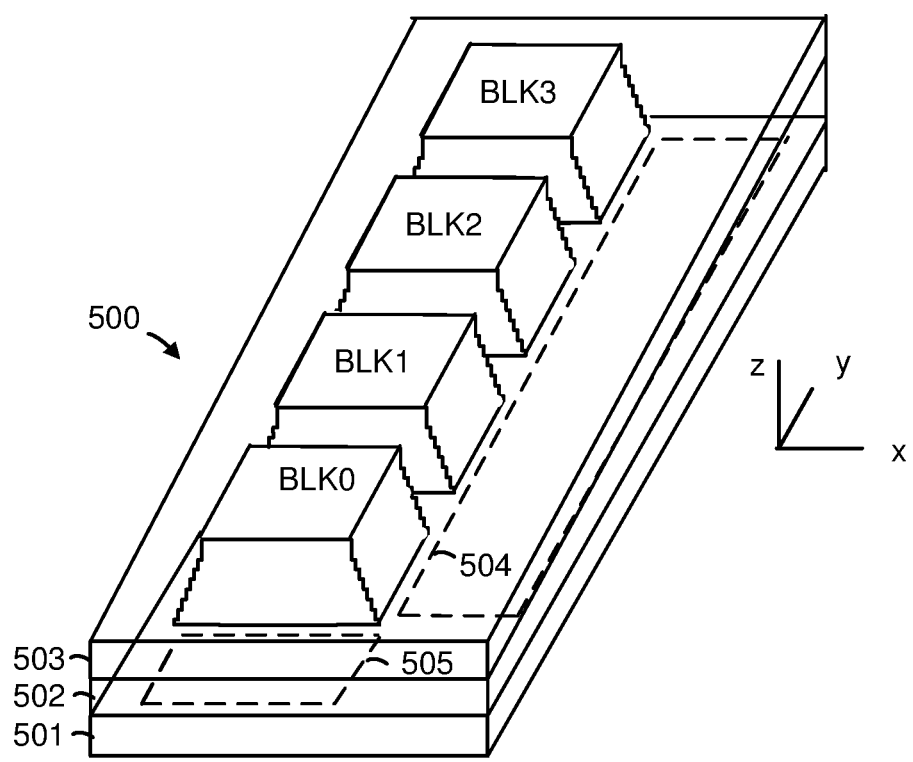
FIG. 4 is a perspective view of a memory device 500 comprising a set of blocks in an example 3D configuration of the memory structure 126 of FIG. 1A.

FIG. 4 is a perspective view of a memory device 500 comprising a set of blocks in an example 3D configuration of the memory structure 126 of FIG. 1A. On the substrate 501 are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5C:
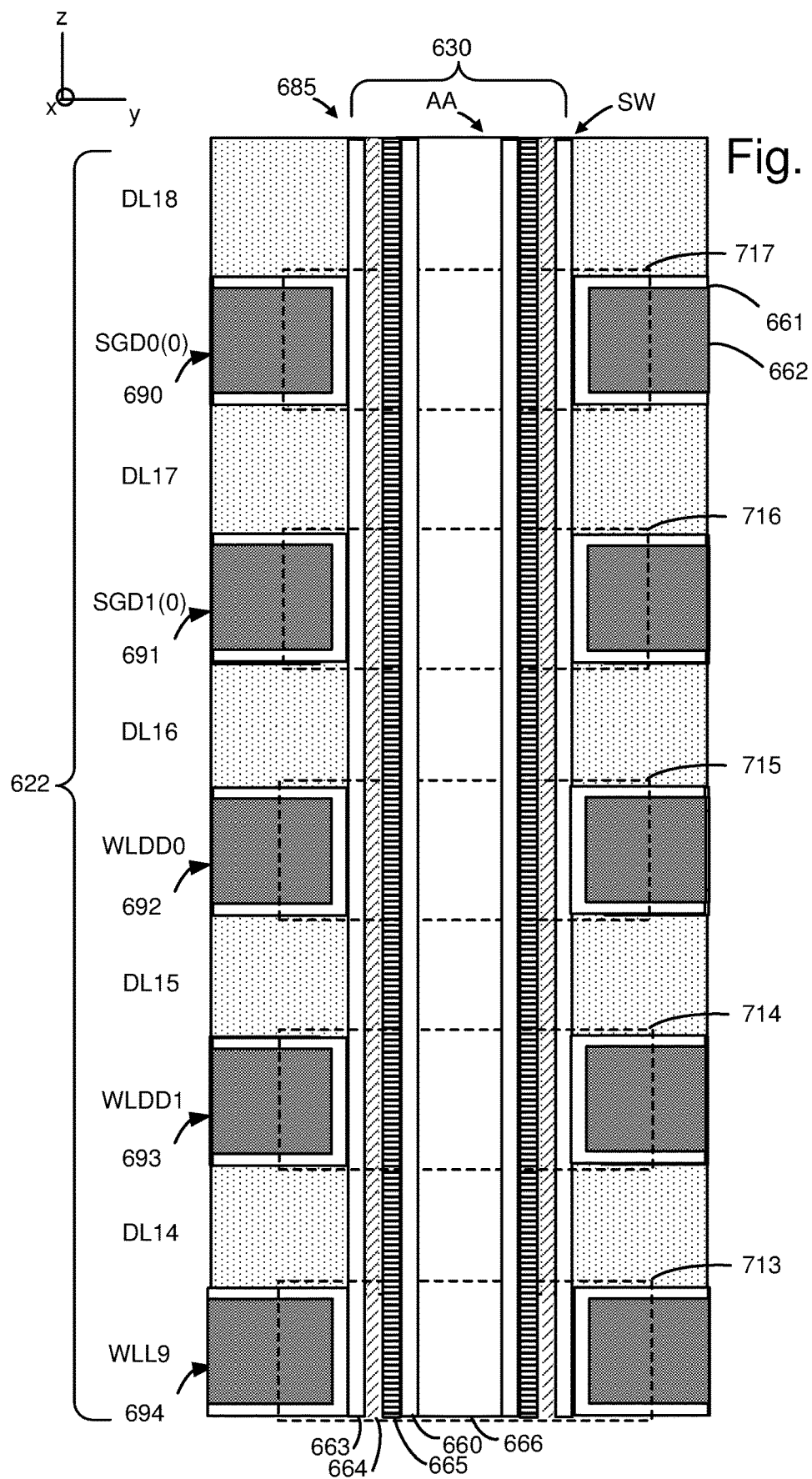
FIG. 5C depicts a close-up view of the region 622 of the stack of FIG. 5A.

FIG. 5A depicts an example cross-sectional view of a portion of BLK0 of FIG. 4. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and ten data word line layers (or data word lines) WLL0-WLL9. WLL0 is a source side data word line and WLDS1 is a dummy word line layer which is adjacent to the source side data word line. WLDS0 is another dummy word line layer which is adjacent to WLDS1. WLL9 is a drain side data word line and WLDD1 is a dummy word line layer which is adjacent to the drain side data word line. WLDD0 is another dummy word line layer which is adjacent to WLDD1. The dielectric layers are labelled as DL1-DL18. Further, regions of the stack which comprise NAND strings 700n and 710n are depicted. Each NAND string encompasses a memory hole 618 or 619 which is filled with materials which form memory cells adjacent to the word lines. Region 622 of the stack is shown in greater detail in FIG. 5C.

The stack includes a substrate 611. In one approach, a portion of the source line SL comprises a well region 433 (see also FIG. 3) as an n-type source diffusion layer or well in the substrate. The well region is in contact with a source end of each string of memory cells in a block. An erase pulse may be applied to this layer in an erase operation. The n-type well region 433 is formed in a p-type well region 611a, which in turn is formed in an n-type well region 611b, which in turn is formed in a p-type semiconductor substrate 611c, in one possible implementation. The n-type source diffusion layer may be shared by all of the blocks in a plane, in one approach.

NAND string 700n has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 5B depicts an example transistor 650. The transistor comprises a control gate CG, a drain D, a source S and a channel CH and may represent a memory cell or a select gate transistor, for example.

FIG. 5C depicts a close-up view of the region 622 of the stack of FIG. 5A. Memory cells are formed at the different levels of the stack at the intersection of a word line layer and a memory hole. In this example, SGD transistors 717 and 716 are provided above dummy memory cells 715 and 714 and a data memory cell 713. These SGD transistors are at the drain end of the NAND string.

A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., comprising a gate oxide which may degrade over time), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively. The channel 700a extends continuously in the NAND strings 700n from the SGS transistor 701 to the SGD transistors 716 and 717. The channel 700a is continuous in that it is uninterrupted and can therefore provide a continuous conductive path in the NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 6:
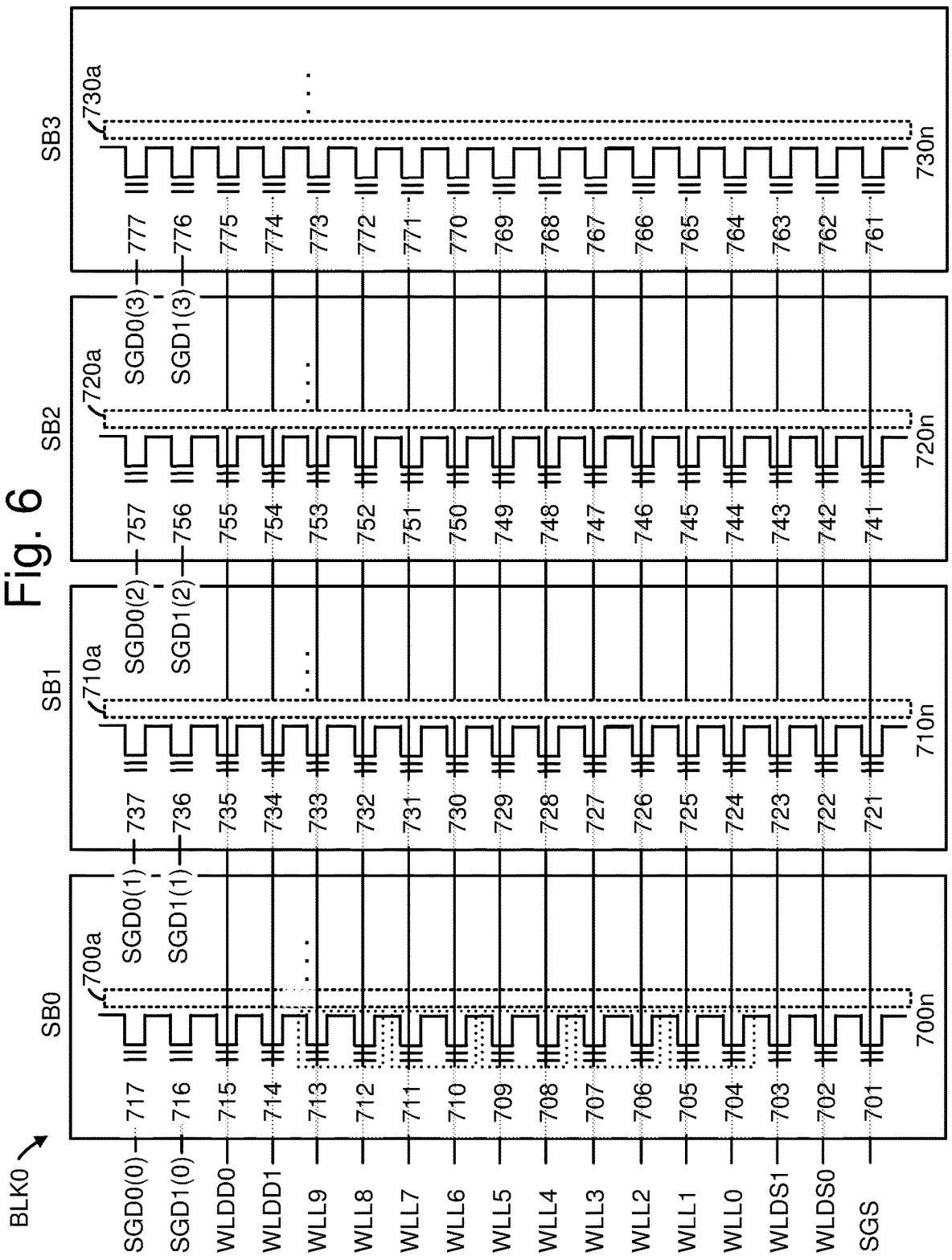
FIG. 6 depicts an example view of NAND strings in BLK0 which is consistent with FIGS. 4 and 5A.

FIG. 6 depicts an example view of NAND strings in BLK0 which is consistent with FIGS. 4 and 5A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 5A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. Another option programs all of the memory cells in one sub-block, one word line portion at a time, before programming the memory cells of the next sub-block. The word line programming order may start at WL0, the source-end word line and end at WLL9, the drain-end word line, for example.

The NAND strings 700n, 710n, 720n and 730n have channels 700a, 710a, 720a and 730a, respectively.

Additionally, NAND string 700n includes SGS transistor 701, dummy memory cells 702 and 703, data memory cells 704-713, dummy memory cells 714 and 715, and SGD transistors 716 and 717. NAND string 710n includes SGS transistor 721, dummy memory cells 722 and 723, data memory cells 724-733, dummy memory cells 734 and 735, and SGD transistors 736 and 737. NAND string 720n includes SGS transistor 741, dummy memory cells 742 and 743, data memory cells 744-753, dummy memory cells 754 and 755, and SGD transistors 756 and 757. NAND string 730n includes SGS transistor 761, dummy memory cells 762 and 763, data memory cells 764-773, dummy memory cells 774 and 775, and SGD transistors 776 and 777.

One or more SGD transistors are provided at the drain-end of each NAND string, and one or more SGS transistors are provided at the source-end of each NAND string. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 may be driven by separate control lines SGS(0), SGS(1), SGS(2) and SGS(3), respectively. In another approach, all of the SGS transistors in a block are connected and commonly driven.

Figure 7:
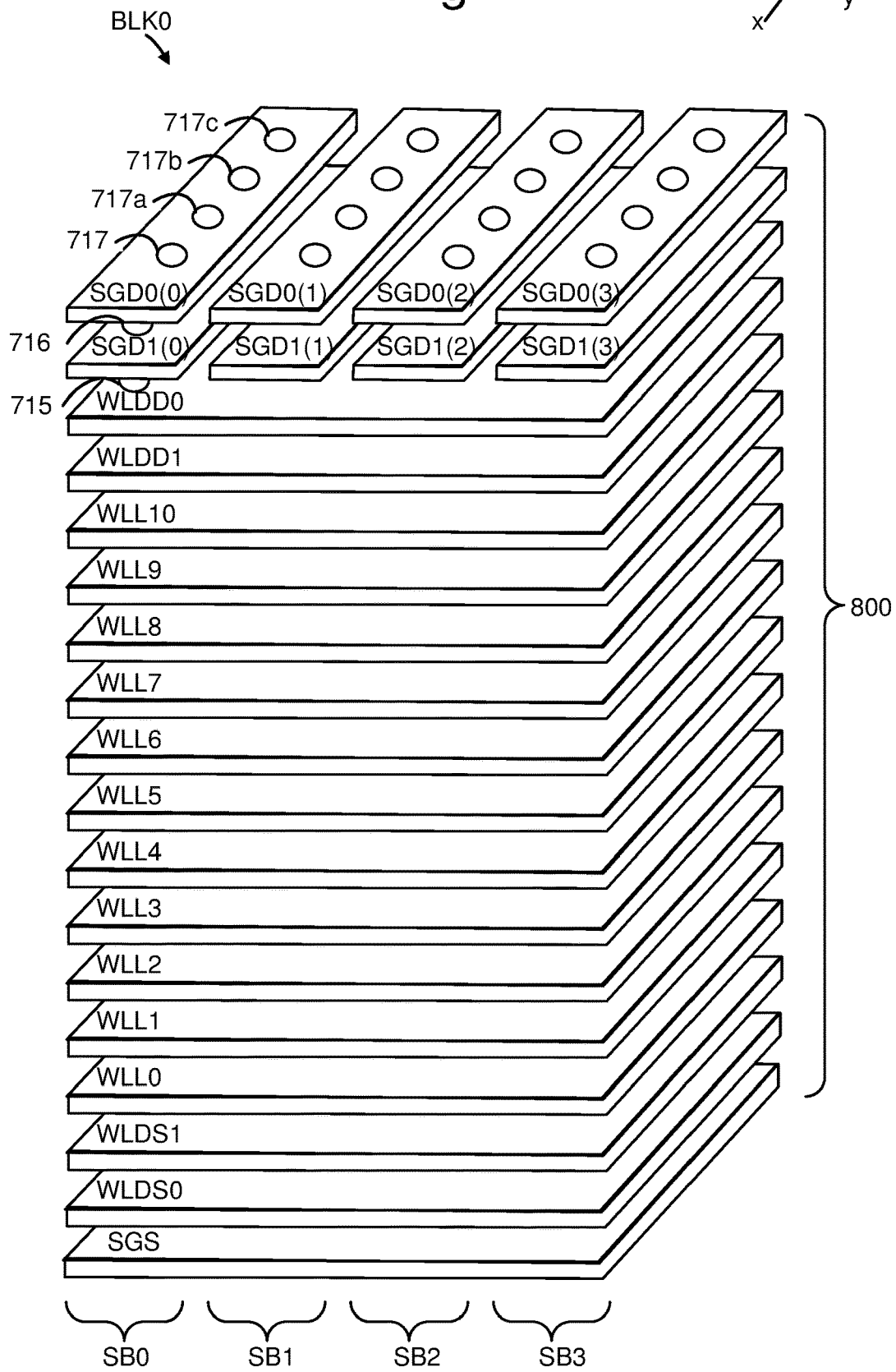
FIG. 7 depicts control gate layers in BLK0 consistent with FIG. 6.

FIG. 7 depicts control gate layers in BLK0 consistent with FIG. 6. The control gate layers are arranged in a stack 800 and include dummy word lines layers or control gate layers WLDS0, WLDS1, WLDD0 and WLDD1, and data word line layers or control gate layers WLL0-WLL9, which are shared among the different sub-blocks SB0-SB3. The control gate layers include a common SGS control gate layer for the block. Optionally, a separate SGS control gate layer could be provided for each sub-block. For example, SB0, SB1, SB2 and SB3 include SGD0(0) and SGD1(0), SGD0 (1) and SGD1(1), SGD0(2) and SGD1(2), and SB3 SGD0(3) and SGD1(3), respectively. Additionally, four example memory holes are depicted in each sub-block. SGD transistors 717, 717a, 717b and 717c are depicted in SGD0(0), SGD transistor 716 is depicted in SGD1(0) and a dummy memory cell 715 is depicted in WLDD0.

Figure 8:
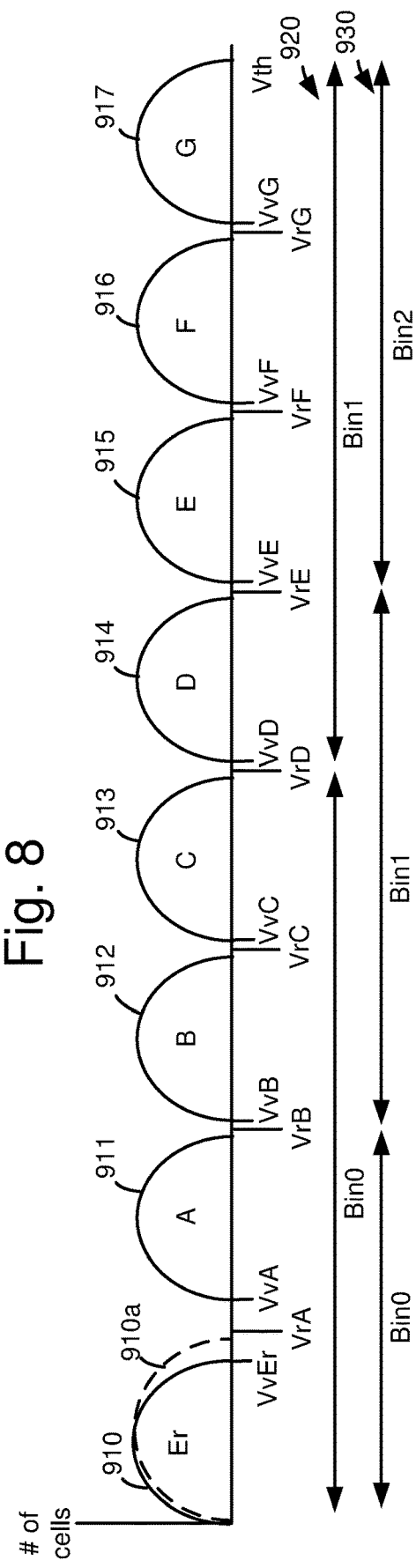
FIG. 8 depicts an example Vth distribution of a set of MLC memory cells in eight data states.

FIG. 8 depicts an example Vth distribution of a set of MLC memory cells in eight data states. In one approach, at a start of a program operation, the memory cells are all initially in the erased state as represented by the Vth distribution 910. After the program operation is successfully completed, the memory cells assigned to the Er state are represented by the Vth distribution 910a, where the Vth distribution is upshifted due to program disturb.

The memory cells which are programmed to the A, B, C, D, E, F and G states using verify voltages of VvA, VvB, VvC, VvD, VvE, VvF and VvG, respectively, are represented by the Vth distributions 911, 912, 913, 914, 915, 916 and 917, respectively. The verify voltages are used in the program-verify tests of the memory cells. Read voltages VrA, VrB, VrC, VrD, VrE, VrF and VrG can be used for reading the states of the memory cells in a read operation. These verify voltages and read voltages are examples of control gate read levels of the selected word line voltage.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr. This example provides eight data states, but other approaches are possible.

FIG. 8 also depicts examples of bins or ranges of Vth values. One example of a set of bins 920 includes Bin0 (a low Vth bin, or a first bin), which extends below VrD, and Bin1 (a high Vth bin, or a second bin) which extends above VrD, for a total of two bins. Another example of a set of bins 930 includes Bin0 (a low Vth bin, or a first bin), which extends below VrB, Bin1 (a medium Vth bin, or a second bin) which extends from VrB to VrE, and Bin2 (a high Vth bin, or a third bin) which extends above VrE. In these examples, the bins are defined using the a subset of the same nominal control gate read voltages (e.g., VrA-VrG) which distinguish the data states when reading the selected memory cells of WLn. This can provide a simpler implementation by reducing the number of voltages which the voltages driver provide. In another approach, the read voltages which define the bins can be different than the nominal control gate read voltages for the selected memory cells. Also, the set of bins 920 divides the range of Vth values of the data states into two roughly equal parts, and the set of bins 930 divides the range of Vth values of the data states into three roughly equal parts, but other approaches are possible. The number of bins, and the ranges of the bins, can be the same or different on WLn−1 and WLn+1, as explained further by the examples below.

Figure 9A:
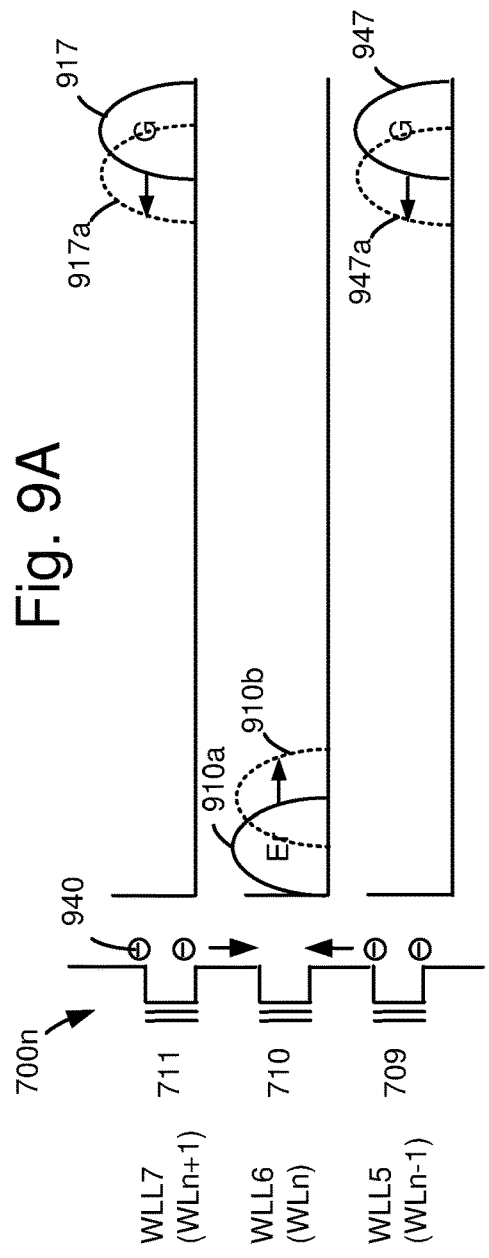
FIG. 9A depicts memory cells in the NAND string 700n of FIG. 7 and one example of shifts in their Vth distributions based on the Vth of adjacent memory cells.

FIG. 9A depicts memory cells in the NAND string 700n of FIG. 7 and one example of shifts in their Vth distributions based on the Vth of adjacent memory cells. As mentioned at the outset, the Vth of a given memory cell can shift after programming due to movement of electrons in the charge trapping layer, where the movement is a function of the Vth or data states of the adjacent memory cells. As an example, a portion of the NAND string 700n of FIG. 6 is repeated, showing the memory cells 709-711 which are connected to word lines WLL5-WLL5, respectively, also referred to as WLn−1, WLn and WLn+1, respectively. The movement of electrons, including an example electron 940, is also depicted for a situation where the memory cells 709-711 are in the G, Er and G states, respectively. The Vth distribution 910a which includes the memory cell 710 is shifted higher to a Vth distribution 910b due to electron diffusion toward the memory cell 710 from the memory cells 709 and 711. In contrast, the Vth distributions 947 and 917 which include the memory cells 709 and 711, respectively, are shifted lower to the Vth distributions 947a and 917a, respectively, due to electron diffusion away from these memory cells and toward the memory cell 710. The amount of electron diffusion can be comparable on average for either of the adjacent memory cells, so that it is relevant to provide compensation based on the Vth of both of the adjacent memory cells.

Generally, a larger Vth shift will occur when there is a larger different between the Vth of two adjacent memory cells. Moreover, both the memory cells of WLn−1 and WLn+1 affect the Vth of the memory cell of WLn.

A read process can be implemented based on an assumption that the Vth of the WLn memory cell is affected after the WLn+1 memory cell is programmed, as a function of the Vth of the WLn+1 memory cell. This is an example of neighbor word line interference, which may result from parasitic cells. A parasitic cell can be formed between memory cells in a continuous charge trapping layer of a NAND string due to a fringing electric field of a selected word line. The fringing electric field results in some electrons being drawn into regions of the charge trapping layer which are between the selected word line and adjacent word lines, when a program voltage is applied to the selected word line. The electrons are trapped and essentially form an inter-cell region having its own Vth. Additionally, in a NAND string, the Vth of a parasitic cell is higher when the data state of the selected memory cell is higher because the fringing electric field is greater as a higher Vpgm is applied to the selected memory cell to complete its programming, while the NAND string is not yet inhibited from programming.

Parasitic cells which are formed after a given word line (WLn) has been programmed have a stronger effect on the apparent Vth of the memory cells of the given word line during a subsequent read operation, compared to parasitic cells which are formed before the given word line has been programmed. This is because the verify tests of the memory cells of WLn are done with the parasitic cells present between WLn and WLn−1. Parasitic cells can also be present between WLn and WLn+1 which are formed by the programming of WLn, at the time of the verify tests of WLn. However, these parasitic cells are formed from the fringing field of WLn and have not yet been strengthened by the fringing field due to programming of WLn+1. The read process described herein can account for parasitic cells as well as for charge migration which occurs from both adjacent memory cells of a selected memory cell being read.

FIG. 9B depicts memory cells in the NAND string 700n of FIG. 7 and another example of shifts in their Vth distributions based on the Vth of adjacent memory cells. In this example, there is a smaller Vth difference between the memory cell 710 and the memory cells 709 and 711 than in FIG. 9A so that there is a smaller Vth shift for the memory cells. The movement of electrons is depicted for a situation where the memory cells 709-711 are in the Er, D and G states, respectively. The Vth distribution 950 of the memory cell 710 is not significantly shifted in this example since the memory cell 709 has a lower Vth and the memory cell 711 has a higher Vth, and the difference in Vth between the D and G states is about the same as the difference in Vth between the Er and D states. The Vth distribution could experience an increase in its upper tail due to the Vth of the memory cell 711, and a decrease in its lower tail due to the Vth of the memory cell 709. The Vth distribution 917 of the memory cell 711 shifts lower to a Vth distribution 917, but this shift is less than the downshift of the memory cell in FIG. 9A. The Vth distribution 910a of the memory cell 709 shifts higher to a Vth distribution 910c, but this shift is less in magnitude than the shift in FIG. 9A and is an upshift rather than a downshift.

FIG. 10 depicts a voltage signal used in a series of program loops in an example program operation for MLC memory cells which results in the Vth distribution of FIG. 8. During a program operation, program loops are performed for a selected word line in a selected block. A program loop comprises a program portion in which a program voltage or pulse is applied to the selected word line followed by a verify portion in which a verify signal is applied to the selected word line while one or more verify tests, referred to as program-verify tests, are performed for the associated memory cells. Other than the erased state, each assigned state has a verify voltage which is used in the verify test for the state in a program operation.

The voltage signal 1000 includes a series of program voltages, including an initial program voltage 1001, which are applied to a word line selected for programming. In this example, the voltage signal includes program voltages which increase stepwise in amplitude in one or more program loops of a programming pass using a fixed or varying step size. This is referred to as incremental step pulse programming, where the program voltage starts at an initial voltage (see program voltage 1001) and increases in a step in each successive program loop, for instance, until the program operation is completed. The operation is successfully completed when the threshold voltages of the selected memory cells reach the verify voltages of the assigned data states.

A program operation can include a single programming pass or multiple programming passes, where each pass uses incremental step pulse programming, for instance.

The verify signal in each program loop, including example verify signal 1002, can include one or more verify voltages, based on the assigned data states which are being verified for the program loop. The verify tests can encompass lower assigned data states and then midrange assigned data states and then higher assigned data states as the program operations proceeds. The example verify signals depict three verify voltages as a simplification.

All memory cells may initially be in the erased state at the beginning of the program operation, for instance. After the program operation is completed, the data can be read from the memory cells using read voltages which are between the Vth distributions. At the same time, a read pass voltage, Vread (e.g., 8-10 V), also referred to as pass voltage or turn-on voltage, is applied to the remaining (unselected) word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE. See also FIG. 8. The data of the middle page can be determined by reading the memory cells using read voltages of VrB, VrD and VrF. The data of the upper page can be determined by reading the memory cells using read voltages of VrC and VrG.

FIG. 11A depicts a process for reading a selected memory cell with compensation based on the threshold voltage (Vth) of adjacent memory cells. Step 1100 includes identifying the Vth of adjacent memory cells of a selected memory cell in each NAND string of a set of NAND strings. The Vth can be classified into a bin or range of Vth values in a set of bins. See also FIGS. 8 and 12A-12F for examples of bins. To reduce complexity, the number of bins can be less than the number of data states. Step 1101 includes reading each selected memory cell with a compensation or adjustment based on the Vth of the adjacent memory cells. The compensation can involve adjusting the read pass voltage of WLn−1 and/or WLn+1, and/or adjusting the read voltage on WLn, for instance.

FIG. 11B depicts an example process consistent with FIG. 11A for reading memory cells of a selected non-edge word line (WLn) while compensating for the threshold voltages of adjacent memory cells. A selected non-edge word line may be, e.g., a data word line which is not the bottommost or topmost data word line in a vertical NAND string. For example, in FIG. 6, this could be WLL1-WLL8, where WLL0 and WLL9 are edge word lines. A further assumption is that the non-edge word line is not an open word line, that is, both adjacent word lines have been programmed when the non-edge word line is being read. For instance, all word lines in a block may have been programmed when the non-edge word line is being read.

At step 1110, a read command is received for a selected non-edge word line. For example, the command may be received by the controller 122 from the host 140. Step 1111 includes reading the memory cells of WLn−1 and WLn+1 to classify their Vth into bins, and storing a respective bin combination for each pair of adjacent memory cells in respective latches. For example, the memory cells of WLn−1 may be read, followed by reading the memory cells of WLn+1. A bin combination can be identified by a bit sequence which identifies the bin into which the WLn−1 memory cell is classified and the bin into which the WLn+1 memory cell is classified. Step 1112 includes reading the selected memory cells of WLn repeatedly with compensation on WLn−1, WLn+1 and/or WLn for each bin combination. The compensation may be different for each bin combination. Step 1113 includes selecting a read result for each selected memory cell based on the respective bin combination of the memory cell.

For example, when reading a lower page of data such as in the examples of FIG. 13-19, multiple read results will be obtained for the VrA read which distinguishes between the Er state cells and the A state cells, and one of these read results will be selected as the result which optimally compensates for charge diffusion between the memory cells. Subsequently, multiple read results will be obtained for the VrE read which distinguishes between the D state cells and the E state cells, and one of these read results will be selected as the optimal result.

In one approach, the number of bins into which a Vth is classified is an increasing function of temperature. As temperature increases, the amount of charge diffusion can also increase. In this case, it can be helpful to implement the compensation with a higher granularity by using a larger number of bins. It is also possible to change the Vth range of the bins based on temperature even if the number of bins does not change. One approach includes classifying the threshold voltage of a first and/or second adjacent memory cell into a number of bins, wherein the number of bins is an increasing function of temperature.

In another option, a read operation is performed without compensation when the temperature is below a threshold temperature and with compensation when the temperature is at or above the threshold temperature. In another option, a read operation is performed with some compensation when the temperature is below a threshold temperature and with more compensation (e.g., more granular, using more bins) when the temperature is at or above the threshold temperature.

In another option, the read pass voltages are increased when the temperature is decreased. That is, the read pass voltage is a decreasing function of temperature. This is done because there is less overdrive for the memory cells when the temperature is lower. The Vth of the memory cells increases when the temperature decreases due to a negative temperature coefficient. Accordingly, the overdrive, or the amount by which the read pass voltage exceeds the Vth of the memory cell, is lower when the temperature is lower. Increasing the read pass voltages when the temperature is lower compensates for this effect. The read pass voltages can be adjusted for the adjacent word lines as well as the other remaining unselected word lines and even the selected word line.

FIG. 11B provides an example of classifying threshold voltages of first and second memory cells in a NAND string, and reading a selected memory cell in the NAND string between, and adjacent to, the first memory cell and the second memory cell with compensation, the compensation is based on the classifying of the threshold voltage of the first memory cell and the classifying of the threshold voltage of a second memory cell.

FIG. 11C depicts an example process consistent with FIG. 11A for reading memory cells of a selected edge word line while compensating for the threshold voltages of adjacent memory cells. At step 1120, a read command is received for a selected edge word line, WLn. Step 1121 includes reading the memory cells of one adjacent data word line (WLn−1 or WLn+1, but not both) to classify their Vth into bins, and storing a respective bin combination for each selected memory cell in respective latches. Step 1122 includes reading the selected memory cells of WLn repeatedly with compensation on the adjacent data word line, an adjacent dummy word line and/or WLn for each bin combination.

For example, if the edge word line is the bottommost or source side data word line, WL0, step 1121 can read WLn+1 or WL1. The other adjacent word line (WLn−1) may be WLDS1, a dummy word line, in the example of FIG. 6. The dummy memory cells of this word line are not programmed and have a predetermined, known Vth, which is typically 0-1 V. Time can be saved by not reading dummy memory cells. The compensation applied can be based on the known data state of the WLn−1 memory cells. Step 1123 includes selecting a read result for each selected memory cell based on the respective bin combination of the memory cell.

If the edge word line is the topmost or drain side data word line, e.g., WL9, step 1121 can read WLn−1 or WL8. The other adjacent word line (WLn+1) may be WLDD1, a dummy word line, in the example of FIG. 6. The dummy memory cells of this word line are not programmed and are assumed to have a predetermined, known Vth, which is typically 0-1 V. The compensation applied can be based on the known data state of the WLn+1 memory cells.

FIG. 11D depicts an example process consistent with FIG. 11A for reading memory cells of a selected open word line while compensating for the threshold voltages of adjacent memory cells. An open word line is a word line for which the adjacent, later programmed word line has not yet been programmed. An open word line exists in a partially programmed block. For example, in FIG. 6, assume the memory cells of WLL0-WLL6 have been programmed but not the memory cells of WLL7-WLL9. When WLL6 is selected for reading, it is an open word line. At step 1130, a read command is received for a selected open word line, WLn. Step 1131 includes reading the memory cells of WLn−1 (but not WLn+1) to classify their Vth into bins, and storing a respective bin combination for each selected memory cell in respective latches. Step 1132 includes reading the selected memory cells of WLn repeatedly with compensation on WLn−1, WLn+1 and/or WLn for each bin combination. Step 1133 includes selecting a read result for each selected memory cell based on the respective bin combination of the memory cell.

Since WLn+1 is unprogrammed, it is known that the memory cells are in an erased state, and time can be saved by not reading these memory cells. The compensation applied can be based on the known data state of the WLn+1 memory cells.

In one embodiment, when the selected memory cell is not connected to an edge or open word line, a control circuit is configured to provide compensation using a total of N latches to classify the threshold voltage of the first and second memory cells, where N is a positive integer. When the selected memory cell is connected to an edge or open word line, the control circuit is configured to provide the compensation using the N latches to classify the threshold voltage of the first memory cell. For example, when the selected memory cell is not connected to an edge or open word line, a first latch can be used to classify the threshold voltage of the first memory cell into a low or high bin, and a second latch can be used to classify the threshold voltage of the second memory cell into a low or high bin. A total of two latches are used. See FIG. 12A. When the selected memory cell is connected to an edge or open word line, the two latches can be used to classify the threshold voltage of the first memory cell into three or four bins. For instance, the three bins can be low, medium and high, as in FIG. 12E, and the four bins can be low, medium low, medium high and high.

Figure 11E:
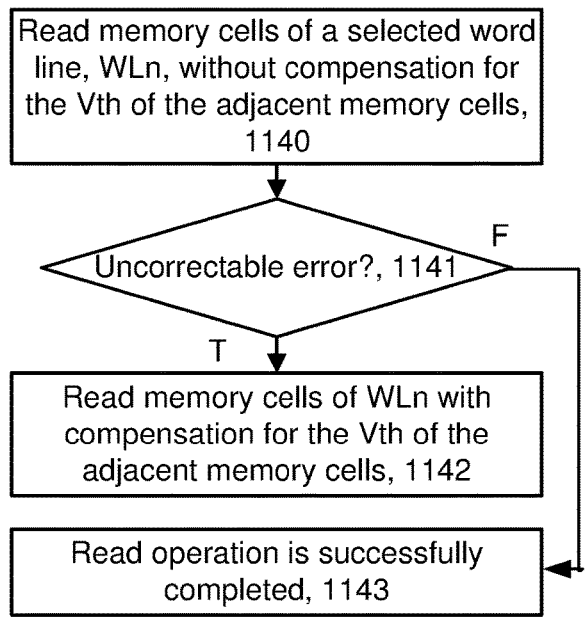
FIG. 11E depicts an example process consistent with FIG. 11A for reading memory cells without compensating for the threshold voltages of adjacent memory cells, then re-reading the memory cells while compensating for the threshold voltages of the adjacent memory cells.

FIG. 11E depicts an example process consistent with FIG. 11A for reading memory cells without compensating for the threshold voltages of adjacent memory cells, then re-reading the memory cells while compensating for the threshold voltages of the adjacent memory cells. A read operation which includes compensation typically requires additional time due to the reading of the WLn−1 and/or WLn+1 memory cells and the repeated reads of the WLn memory cells. Accordingly, it can be efficient to selectively implement a read operation with compensation. In one approach, a read operation with compensation can be performed when a previous read operation without compensation results in an uncorrectable error.

Step 1140 includes reading memory cells of a selected word line, WLn, without compensation for the Vth of the adjacent memory cells. For example, a page of data can be read and decoded using the ECC engine 245 of FIG. 1A. A decision step 1141 determines if there is an uncorrectable error. If the decision step is false, the read operation is successfully completed at step 1143. If the decision step is true, another read operation, or a re-read is performed. Step 1142 includes reading the memory cells of WLn with compensation for the Vth of the adjacent memory cells. If the re-read results in no uncorrectable errors, the read operation is successfully completed. If the re-read also results in an uncorrectable error, a recovery read can be performed in which the selected memory cells are read with many closely-spaced read voltages.

In one embodiment, reading a selected memory cell with the compensation (step 1142) occurs in response to a prior read operation (step 1140) involving the selected memory cell resulting in an uncorrectable error, where the prior read operation is not compensated based on the classifying of the threshold voltages of the first and second memory cells.

In one embodiment, a threshold voltage of a first memory cell is classified into a first number of bins N1+1 when the selected word line is an edge or open word line, by reading the first memory cell using N1 read voltages. In this case, compensation of the selected memory cell is based on the classifying of the threshold voltage of the first memory cell and a predetermined threshold voltage of the second memory cell.

Additionally, the threshold voltage of the first memory cell is classified into a second number of bins N2+1 which is less than the first number of bins, when the selected word line is not an edge or open word line, by reading the first memory cell using N2 read voltages, where N2>N1 and N1 and N2 are positive integers. The second memory cell is also classified into a number of bins. In this case, compensation of the selected memory cell is based on the classifying of the threshold voltages of the first and second memory cells.

Figure 11F:
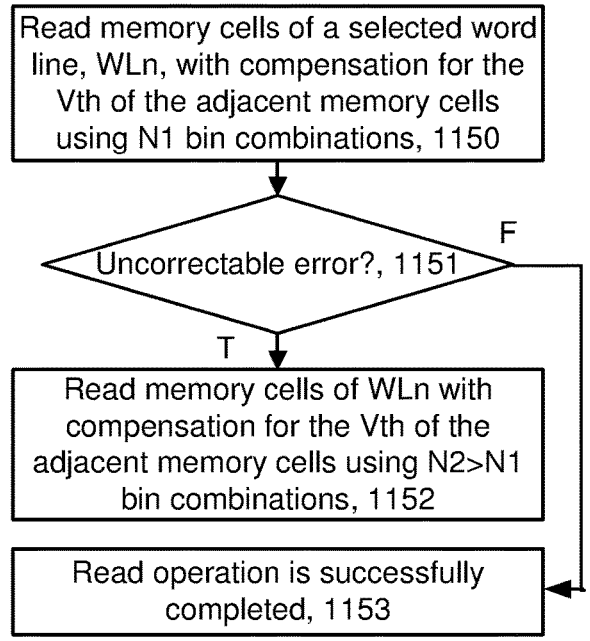
FIG. 11F depicts an example process consistent with FIG. 11A and an alternative to FIG. 11E for reading memory cells while compensating for the threshold voltages of adjacent memory cells using N1 bin combinations, then re-reading the memory cells while compensating for the threshold voltages of the adjacent memory cells using N2>N1 bin combinations.

FIG. 11F depicts an example process consistent with FIG. 11A and an alternative to FIG. 11E for reading memory cells while compensating for the threshold voltages of adjacent memory cells using N1 bin combinations, then re-reading the memory cells while compensating for the threshold voltages of the adjacent memory cells using N2>N1 bin combinations. In the example of FIG. 8, the set of bins 920 and 930 included two and three bins, respectively. The two bins can be defined by one read operation, e.g., at VrD. The memory cells having a Vth<VrD can be classified in a first bin, and the memory cells having a Vth>=VrD can be classified in a second bin. Or, the three bins can be defined by two read operations, e.g., at VrB and VrE. The memory cells having a Vth<VrB can be classified in a first bin, the memory cells having a Vth between VrB and VrE can be classified in a second bin, and the memory cells having a Vth>=VrE can be classified in a third bin.

In this approach, a read operation with a high granularity or degree of compensation can be performed when a previous read operation with a low granularity or degree of compensation results in an uncorrectable error. This approach saves some time by attempting to perform a successful read using a low granularity of compensation. The degree of granularity may refer to the number of bin combinations which are compensated for in a read operation. A higher degree of granularity will generally involve a higher numbers of reads on WLn-1 and WLn+1 and a higher number of repeated reads on WLn.

Step 1150 includes reading memory cells of a selected word line, WLn, with compensation for the Vth of the adjacent memory cells using N1 bin combinations. A decision step 1151 determines if there is an uncorrectable error. If the decision step is false, the read operation is successfully completed at step 1153. If the decision step is true, another read operation, or a re-read is performed. Step 1152 includes reading the memory cells of WLn with compensation for the Vth of the adjacent memory cells using N2>N1 bit combinations. N1 and N2 are positive integers. FIG. 12A-12F provide examples of bit combinations and implementations of compensation.

In one embodiment, a control circuit is configured to read a selected memory cell (step 1152) in response to a prior read operation (step 1150) involving the selected memory cell resulting in an uncorrectable error, where the prior read operation compensates for the threshold voltage of the first memory cell but not for the threshold voltage of the second memory cell. The prior read operation uses N1 bin combinations to classify the Vth of the first memory cell. Alternatively, the prior read operation could compensate for the threshold voltage of the second memory cell but not for the threshold voltage of the first memory cell.

FIG. 12A depicts examples of classifying the Vth of memory cells on WLn-1 and WLn+1 into two bins, in example implementations of FIG. 11B. The two bins may correspond the set of bins 920 in FIG. 8, for example. Generally, N bins are defined by N-1 read operations. N is a positive integer.

Example 1 involve applying a compensation (comp.) on WLn-1 and WLn+1. The "WLn-1/WLn+1" column denotes the bin into which memory cell of WLn-1/WLn+1 are classified or assigned based on their Vth. For instance, "WLn-1/WLn+1"=low/high indicates the Vth of the memory cell on WLn-1 is relatively low and the Vth of the memory cell on WLn+1 is relatively high. The "low" bin and the "high" bin may refer to Bin0 and Bin1, respectively, in the set of bins 920 of FIG. 8, for example. Note that the bin definitions can be different or the same for WLn-1 and WLn+1. The "Vread(n-1)/(n+1)" column denotes the read pass voltages for WLn-1/WLn+1 when reading the memory cell of WLn. For example, we have Vread_low, Vread_med. (med. denotes medium) and Vread_high. The Vread levels can be set independently on WLn-1 and WLn+1. Thus, Vread_low, Vread_med. and Vread_high on WLn-1 can be the same or different than Vread_low, Vread_med. and Vread_high, respectively, on WLn-1.

The "BC" or bin combination column refers to an identifier of a bin combination which may be stored in a set of latches for a memory cell. For example, two latches are sufficient to store the bin combinations of 1, 2, 3 and 4 using bit combinations of 00, 01, 10 and 11, respectively. Each BC corresponds to a different combination of bins into which the first and second memory cells of WLn-1 and WLn+1, respectively, are classified. For each BC, a read compensation can be provided using a Vread on WLn-1, a Vread on WLn+1, and/or a read voltage on WLn. For example, BC=1 corresponds to the WLn-1 and WLn+1 memory cells being in a low bin, and to setting a read compensation using a lower than nominal Vread(n-1) and Vread(n+1).

The levels of the nominal, low and high Vread can be optimized based on testing. In one example, the nominal, low and high Vread are 10 V, 9 V and 11 V, respectively. The read pass voltage on WLn-1 can compensate for lateral charge movement between the memory cells of WLn-1 and WLn. The read pass voltage on WLn+1 can compensate for lateral charge movement between the memory cells of WLn+1 and WLn and for neighbor word line interference caused by programming WLn+1 after WLn.

Example 1a reduces the number of bin combinations from four to three by consolidating the bit combinations 2 and 3 of Example 1. This approach is based on a presumption that the effect of a low Vread on WLn-1 and a high Vread on WLn+1 will provide a roughly similar compensation to the WLn memory cell as a high Vread on WLn-1 and a low Vread on WLn+1. In this case, a medium Vread, which is between the low and high Vread, can be used on both WLn-1 and WLn+1 for the bit combinations 2 and 3 of Example 1. This reduces the number of read operations for WLn, thus saving time. The level of the medium Vread can be the same as the nominal Vread, e.g., 10 V, in one example.

In Example 1a, a control circuit is configured to provide compensation based on classifying the threshold voltage of the first memory cell into bins (low or high) and classifying the threshold voltage of the second memory cell into bins (low or high), and providing a number of different levels of the compensation (three levels, corresponding to BC1-BC3) which is less than a number of the bins (two bins) into which threshold voltage of the first memory cell is classified multiplied by a number of the bins (two bins) into which threshold voltage of the second memory cell is classified (resulting in four combinations of bins).

The compensation which is applied to an adjacent word line of WLn is based on the difference between the Vth of the memory cells on WLn and the adjacent word line in each NAND string. For example, in FIG. 9A, the compensation for WLn+1 can be a Vread which is higher than a nominal Vread. The Vth of the WLn+1 memory cell exceed the Vth of the WLn memory cell so the Vth of the WLn memory cell would be sensed as being higher without compensation. That is, the current in a NAND string which is detected in a read operation will be lower when the Vth of the WLn memory cell is higher, if a nominal Vread was used on WLn+1. By using a higher than nominal Vread on WLn+1, the memory cells of WLn+1 will be more conductive and the current in the NAND string will be slightly higher, acting as an offset or compensation for the higher Vth of the WLn memory cell, and making the Vth of the WLn memory cell appear to be lower. Similarly, the compensation for WLn−1 can be a Vread which is higher than a nominal Vread.

In the example of FIG. 9B, the compensation for WLn+1 can be a Vread which is higher than a nominal Vread and the compensation for WLn−1 can be a Vread which is lower than a nominal Vread based on the above-mentioned reasons. Specifically, since the Vth of the WLn−1 memory cell is less than the Vth of the WLn memory cell, the Vth of the WLn memory cell would be sensed as being lower without compensation. That is, the current in the NAND string will be higher when the Vth of the WLn memory cell is lower, if a nominal Vread was used on WLn−1. By using a lower than nominal Vread on WLn−1, the memory cells of WLn−1 will be less conductive and the current in the NAND string will be slightly lower, acting as a compensation for the lower Vth of the WLn memory cell, and making the Vth of the WLn memory cell appear to be higher.

Examples 1 and 1a involve reading a selected memory cell with compensation, where a control circuit is configured to read the selected memory cell while applying a control gate voltage (e.g., VrA, VrE)) to the selected memory cell and different combinations of read pass voltages to the first and second memory cells.

Example 2 applies the compensation only on WLn+1 and a nominal Vread can be applied to WLn−1 and the other unselected word lines. This can provide a simpler implementation since compensated read pass voltages are applied on one, not two, unselected word lines. This example includes four bin combinations. Example 2a reduces the number of bin combinations from four to three, as in Example 1a. A low, medium or high Vread is used for bin combinations 1, 2 and 3, respectively. As depicted, a low Vread is used when WLn−1 and WLn+1 are both low, a medium Vread is used when WLn−1 and WLn+1 are low and high, respectively, or high and low, respectively, and a high Vread is used when WLn−1 and WLn+1 are both high. As an alternative, the compensation can be applied only on WLn−1 (instead of WLn+1) and a nominal Vread can be applied to WLn+1 (instead of WLn−1) and the other unselected word lines.

Examples 3 and 3a apply the compensation only on WLn and a nominal Vread can be applied to WLn−1, WLn+1 and the other unselected word lines. In Example 3, a low, med.-low, med.-high or high VWLn is used for bin combinations 1, 2, 3 and 4, respectively. Example 3a reduces the number of bin combinations from four to three, as in Example 1a. In Example 3a, a low, med. or high VWLn is used for bin combinations 1, 2 and 3, respectively. The low VWLn is used when WLn−1 and WLn+1 are both low, the medium VWLn is used when WLn−1 and WLn+1 are low and high, respectively, or high and low, respectively, and the high VWLn is used when WLn−1 and WLn+1 are both high.

The different Vcgr levels are used to demarcate between adjacent data states on WLn in separate reads. For example, in FIG. 17, a read which distinguishes between the Er and A states uses three control gate or VWLn read levels: VrA_low, VrA_med and VrA_high. One read result among the three is selected for a given memory cell based on the bin combination. Similarly, a read which distinguishes between the D and E states uses three control gate read levels: VrE_low, VrE_med and VrE_high. One read result among the three is again selected for a given memory cell based on the bin combination.

The compensation can be applied on WLn based on the Vth of the adjacent memory cells of WLn−1 and WLn+1. In this case, a compensation can be determined for each combination of a Vth or bin for the adjacent memory cells. In one approach, the Vth of the WLn−1 memory cell is classified into M1 bins, and the Vth of the WLn+1 memory cell is classified into M2 bins. M1 and M2 are positive integers which can be the same or different. The number of bit combinations is M1×M2. The number of latches in the set of latches associated with each memory cell should be sufficient to identify the bit combinations. For example, one, two or three latches are used for up to two, four or eight bit combinations, respectively. Note that even if the latches can store eight bit combinations, for instance, it maybe be desirable to use fewer bit combinations to reduce the read time penalty.

The compensation on WLn could also be combined with compensation on WLn−1 and/or or WLn+1.

FIG. 12B depicts examples of classifying the Vth of memory cells on WLn−1 into two bins, and classifying the memory cells on WLn+1 into three bins, in example implementations of FIG. 11B. This approach can provide a more granular compensation than Example 1 for one adjacent word line by classifying its memory cells into a greater number of bins. In one approach, it is desirable to provide more bins for the WLn+1 memory cells compared to the WLn−1 memory cells since the WLn+1 memory cells provide neighbor word line interference as well as charge diffusion for the WLn memory cells.

In one embodiment, a first memory cell is before a selected memory cell in a word line programming order, a second memory cell is after the selected memory cell in the word line programming order, and a control circuit is configured to provide the compensation based on classifying the first memory cell into a number of bins (e.g., 2) which is less than a number of bins (e.g., 3) into which the threshold voltage of the second memory cell is classified.

Example 4 applies a compensation on WLn−1 and WLn+1 using six bins, where a different bin is used for each combination of bins of WLn−1 and WLn+1. Additionally, two and three different levels of Vread are used on WLn−1 and WLn+1, respectively. Optionally, two and three different levels of Vread can be used on WLn+1 and WLn−1, respectively. Another option is to use one and six different levels of Vread on WLn−1 and WLn+1, respectively, or one and six different levels of Vread on WLn+1 and WLn−1, respectively. Example 4a applies a compensation on WLn−1 and WLn+1 using five bins instead of six by consolidating the low/high and high/low compensation of Vread(n−1)/(n+1) into the med./med. compensation.

Example 5 applies compensation only on WLn+1 using five bin combinations. A nominal Vread can be applied to WLn−1 and the other unselected word lines. In particular, a low, medium-low, medium, medium-high or high Vread is used for bin combinations 1, 2, 3, 4 and 5, respectively.

Example 6 applies compensation only on WLn using five bin combinations. A nominal Vread can be applied to WLn−1, WLn+1 and the other unselected word lines. In particular, VWLn (the voltage on WLn, also referred to as Vcgr) is set to a low, med.-low, med., med.-high or high level for bin combinations 1, 2, 3, 4 and 5, respectively. See FIG. 18.

FIG. 12C depicts examples of classifying the Vth of memory cells on WLn−1 into three bins and classifying the Vth of memory cells on WLn+1 into three bins, in example implementations of FIG. 11B. This approach can provide an even more granular compensation than Example 4 by classifying the memory cells of WLn−1 into three bins, and classifying the memory cells of WLn+1 into three bins. The bins can be the same or different on WLn−1 versus WLn+1. The approach of Example 7 results in nine separate bins. Or, in Example 7a, the number of bins may be reduced to six bins to decrease the time penalty. This involves consolidating the med./low compensation of Vread(n−1)/(n+1) into the low/med. compensation, consolidating the high/low compensation into the low/high compensation, and consolidating the high/med. compensation into the med./high compensation.

FIG. 12D depicts examples of classifying the Vth of memory cells on WLn+1 into two bins for a bottom edge word line (Example 8), and classifying the Vth of memory cells on WLn−1 into two bins for a top edge word line or an open word line (Example 9), in example implementations of FIGS. 11C and 11D. In Example 8, Vread(n−1)/(n+1) are set to nominal (nom.)/low or nom./high when the Vth of the memory cell of WLn+1 is classified into a low or high Vth bin, respectively. In Example 9, Vread(n−1)/(n+1) are set to low/nom. or nom./high when the Vth of the memory cell of WLn−1 is classified into a low or high Vth bin, respectively.

FIG. 12E depicts examples of classifying the Vth of memory cells on WLn+1 into three bins for a bottom edge word line (Example 10), and classifying the Vth of memory cells on WLn−1 into three bins for a top edge word line or an open word line (Example 11), in example implementations of FIGS. 11C and 11D. In Example 10, Vread(n−1)/(n+1) are set to nom./low, nom/med. or nom./high when the Vth of the memory cell of WLn+1 is classified into a low, medium (med.) or high Vth bin, respectively. In Example 11, Vread(n−1)/(n+1) are set to low/nom., med./nom or high/nom. when the Vth of the memory cell of WLn−1 is classified into a low, med. or high Vth bin, respectively.

FIG. 12F depicts examples of classifying the Vth of memory cells on WLn−1 into two bins and classifying the Vth of memory cells on WLn+1 into two bins, using one read operation, in example implementations of FIG. 11B. A single read operation involving WLn−1 and WLn+1 memory cells can indicate whether both of these memory cells have a Vth below the read voltage, or whether one or both have a Vth at or above the read voltage. This approach can save read time and enable a rough form of the compensation to be implemented even with just one latch available to store a bin classification. Example 12 involves compensation on both WLn−1 and WLn+1. Vread(n−1)/(n+1) are set low/low when the Vth of the memory cells of WLn−1/WLn+1 are classified into low/low bins, and high/high when the Vth of the memory cells of WLn−1/WLn+1 are classified into one bin combination (BC2) representing low/high, high/low or high/high bins. Another option is to set Vread (n−1)/(n+1) to med./high or high/med. when the Vth of the memory cells of WLn−1/WLn+1 are classified into BC2.

Example 13 involves compensation on WLn−1 only. Vread(n−1)/(n+1) are set low/nom. when the Vth of the memory cells of WLn−1/WLn+1 are classified into low/low bins, and high/nom. when the Vth of the memory cells of WLn−1/WLn+1 are classified into one bin combination (BC2) representing low/high, high/low or high/high bins.

Example 14 involves compensation on WLn only. Vread (n−1)/(n+1) are set to nom/nom. VWLn is set to low when the Vth of the memory cells of WLn−1/WLn+1 are classified into low/low bins, and to med. when the Vth of the memory cells of WLn−1/WLn+1 are classified into one bin combination (BC2) representing low/high, high/low or high/high bins.

FIG. 13 depicts example word line voltages in an implementation of Example 1 of FIG. 12A. In FIG. 13-19, the vertical direction denotes voltage and the horizontal direction denotes time. The notation Ri, where i is a positive integer, denotes a read or sensing process which occurs on WLn−1, WLn and/or WLn+1. A lower page read is depicted as an example which demarcates between the Er and A states first, and between the D and E states second.

Voltage signals 1300, 1310 and 1320 are applied to WLn+1, WLn and WLn−1, respectively. For each NAND string, the read R1 classifies the WLn+1 memory cells into one of two bins, and the read R2 classifies the WLn−1 memory cells into one of two bins.

For the selected memory cell of WLn, four reads occur to demarcate between the Er and A states while VrA is applied to WLn. The read R3 occurs with a read compensation of Vread_low on WLn−1 and WLn+1. The read R4 occurs with a read compensation of Vread_high and Vread_low on WLn−1 and WLn+1, respectively. The read R5 occurs with a read compensation of Vread_low and Vread_high on WLn−1 and WLn+1, respectively. The read R6 occurs with a read compensation of Vread_high on WLn−1 and WLn+1. During these reads, Vread_nom. may be applied to the other unselected word lines. For a given selected memory cell, one of the read results is selected based on the bin combination stored in the latches and the remaining read results are discarded.

Four reads then occur to demarcate between the D and E states while VrE is applied to WLn. The read R7 occurs with a read compensation of Vread_low on WLn−1 and WLn+1. The read R8 occurs with a read compensation of Vread_high and Vread_low on WLn−1 and WLn+1, respectively. The read R9 occurs with a read compensation of Vread_low and Vread_high on WLn−1 and WLn+1, respectively. The read R10 occurs with a read compensation of Vread_high on WLn−1 and WLn+1. For a given selected memory cell, one of the read results is selected based on the bin combination.

In one option, the compensating read pass voltages are further adjusted as a function of VWLn, the control gate read voltage. In particular, the compensating read pass voltages can be lower (compared the dashed line plot 1322 to the solid line plot 1321) when the control gate read voltage is higher. For instance, Vread_low_L and Vread_high_L can be used in place of Vread_low and Vread_high, respectively, when VWLn=VrE is applied, compared to when VWLn=VrA is applied, since VrE>VrA, where Vread_low_L<Vread_low and Vread_high_L<Vread_high. That is, the compensating read pass voltages are a decreasing function of the control gate read voltage.

The Vth of lower state memory cells is likely to increase due to lateral charge movement while the Vth of higher state memory cells is likely to decrease due to lateral charge movement. These adjustments to the compensating read pass voltages are appropriate in view of the previous discussion, e.g., in connection with FIG. 12A, regarding changes in current in a NAND string due to Vth changes in the memory cells of WLn−1 and WLn+1. An embodiment in which the compensating read pass voltages are lower when the control gate read voltage is higher, includes reading the selected memory cell while applying a series of control gate voltages (e.g., VrA, VrE) to the selected memory cell and different combinations of read pass voltages (e.g., the combination of Vread_low and Vread_high, and the combination of Vread_low_L and Vread_high_L) to the first and second memory cells during each control gate voltage of the series of control gate voltages, wherein the read pass voltages are set based on a decreasing function of the control gate voltages.

The voltage signals 1300 and 1320 during the reading of WLn memory cells could alternatively represent VWLn−1 and VWLn+1, respectively.

Figure 14:
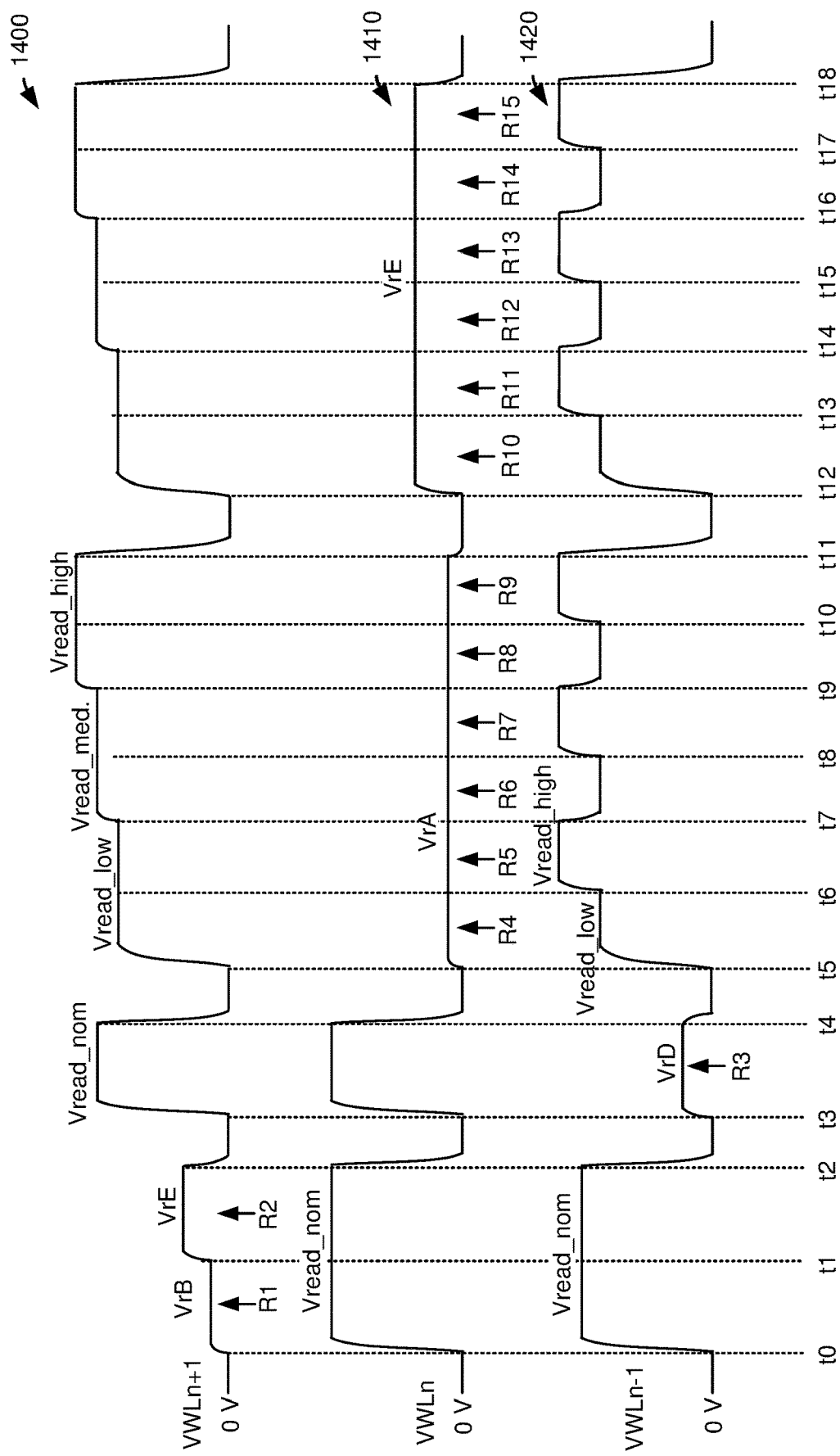
FIG. 14 depicts example word line voltages in an implementation of Example 4 of FIG. 12B.

FIG. 14 depicts example word line voltages in an implementation of Example 4 of FIG. 12B. Voltage signals 1400, 1410 and 1420 are applied to WLn+1, WLn and WLn−1, respectively. For each NAND string, the reads R1 and R2 classify the WLn+1 memory cell into one of three bins, and the read R3 classifies the WLn−1 memory cell into one of two bins.

For the selected memory cell of WLn, six reads occur to demarcate between the Er and A states while VrA is applied to WLn. The read R4 occurs with a read compensation of Vread_low on WLn−1 and WLn+1. The read R5 occurs with a read compensation of Vread_high and Vread_low on WLn−1 and WLn+1, respectively. The read R6 occurs with a read compensation of Vread_low on WLn−1 and Vread_med, on WLn+1. The read R7 occurs with a read compensation of Vread_high and Vread_med. on WLn−1 and WLn+1, respectively. The read R8 occurs with a read compensation of Vread_low and Vread_high on WLn−1 and WLn+1, respectively. The read R9 occurs with a read compensation of Vread_high on WLn−1 and WLn+1. For a given selected memory cell, one of the read results is selected based on the bin combination stored in the latches and the remaining read results are discarded.

Six reads then occur to demarcate between the D and E states while VrE is applied to WLn. Reads R10-R15 are performed with similar compensation as reads R4-R9, respectively. For a given selected memory cell, one of the read results is then selected based on the bin combination.

The voltage signals 1400 and 1420 during the reading of WLn memory cells could alternatively represent VWLn−1 and VWLn+1, respectively.

Figure 15:
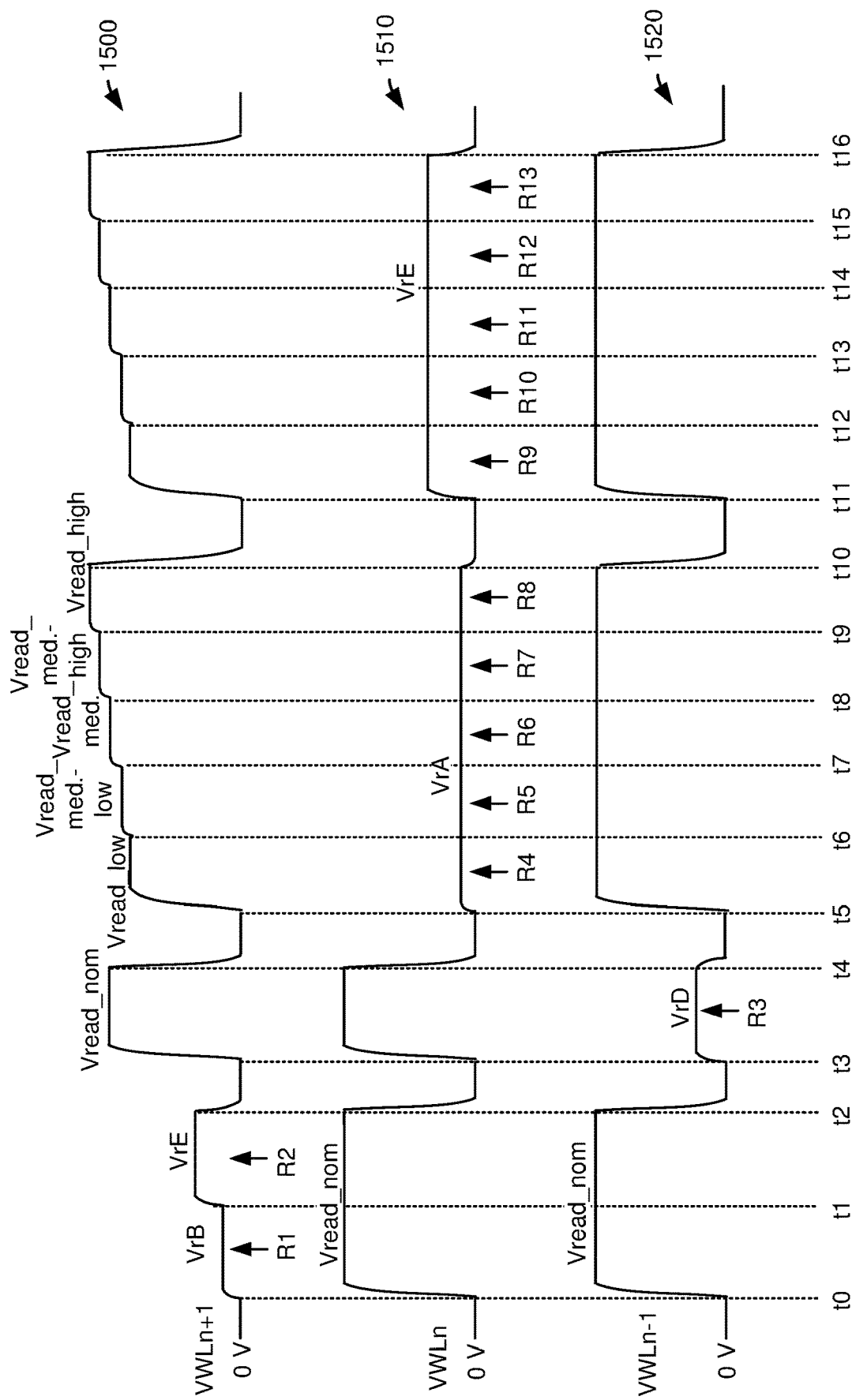
FIG. 15 depicts example word line voltages in an implementation of Example 5 of FIG. 12B.

FIG. 15 depicts example word line voltages in an implementation of Example 5 of FIG. 12B. Voltage signals 1500, 1510 and 1520 are applied to WLn+1, WLn and WLn−1, respectively. For each NAND string, the reads R1 and R2 classify the WLn+1 memory cell into one of three bins, and the read R3 classifies the WLn−1 memory cell into one of two bins.

For the selected memory cell of WLn, five reads occur to demarcate between the Er and A states while VrA is applied to WLn. Vread_nom. is maintained on WLn−1. The reads R4-R8 occur with a read compensation of Vread_low, Vread_med.-low, Vread_med., Vread_med-high and Vread-high, respectively, on WLn+1. For a given selected memory cell, one of the read results is selected based on the bin combination.

Five reads then occur to demarcate between the D and E states while VrE is applied to WLn. Reads R9-R13 are performed with similar compensation as reads R4-R8, respectively. For a given selected memory cell, one of the read results is then selected based on the bin combination.

The voltage signals 1500 and 1520 during the reading of WLn memory cells could alternatively represent VWLn−1 and VWLn+1, respectively.

In one embodiment, to read the selected memory cell with the compensation, a control circuit is configured to: read the selected memory cell while applying a control gate voltage (e.g., VrA, VrA) to the selected memory cell, one read pass voltage to the first memory cell (e.g., Vread_nom.) and different read pass voltages (e.g., Vread_low, Vread_med.-low, Vread_med., Vread_med-high and Vread-high) to the second memory cell.

Figure 16:
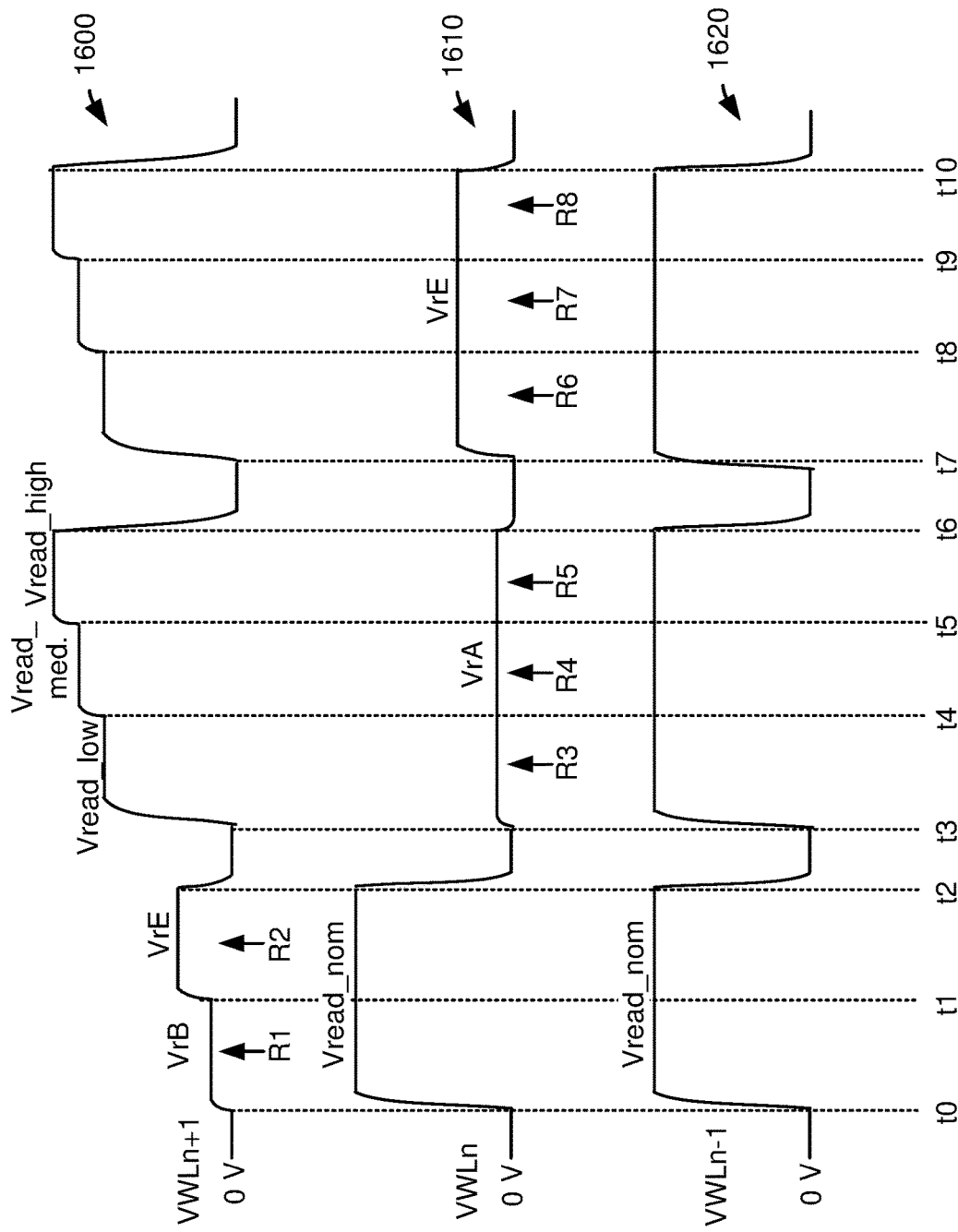
FIG. 16 depicts example word line voltages in an implementation of Example 10 of FIG. 12E.

FIG. 16 depicts example word line voltages in an implementation of Example 10 of FIG. 12E. Voltage signals 1600, 1610 and 1620 are applied to WLn+1, WLn and WLn−1, respectively. For each NAND string, the reads R1 and R2 classify the WLn+1 memory cell into one of three bins. For the selected memory cell of WLn, three reads occur to demarcate between the Er and A states while VrA is applied to WLn. Vread_nom. is maintained on WLn−1. The reads R3-R5 occur with a read compensation of Vread_low, Vread_med. and Vread-high, respectively, on WLn+1. For a given selected memory cell, one of the read results is selected based on the bin combination.

Three reads then occur to demarcate between the D and E states while VrE is applied to WLn. Reads R6-R8 are performed with similar compensation as reads R3-R5, respectively. For a given selected memory cell, one of the read results is then selected based on the bin combination.

The voltage signals 1600 and 1620 during the reading of WLn memory cells could alternatively represent VWLn−1 and VWLn+1, respectively.

Figure 17:
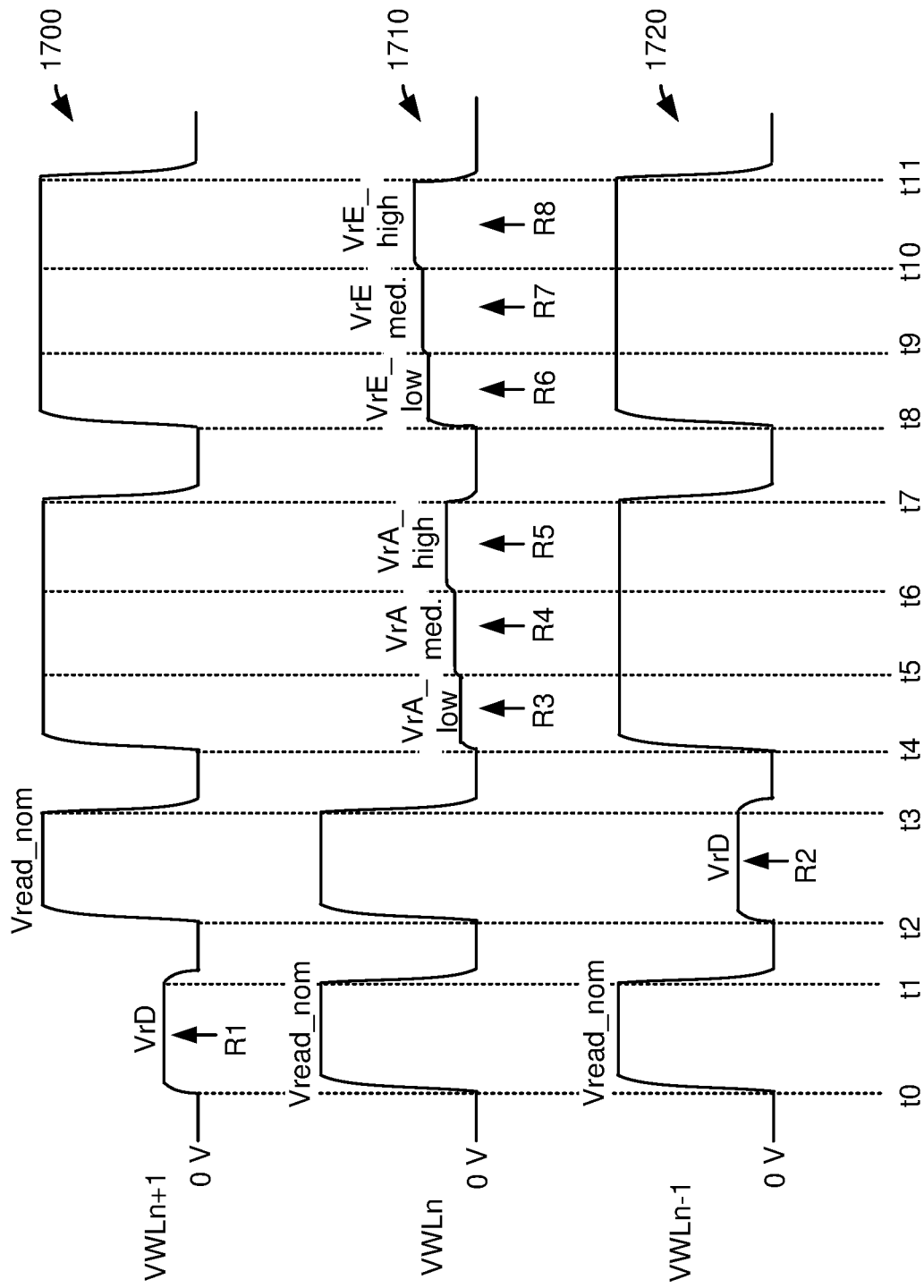
FIG. 17 depicts example word line voltages in an implementation of Example 3a of FIG. 12A.

FIG. 17 depicts example word line voltages in an implementation of Example 3a of FIG. 12A. Voltage signals 1700, 1710 and 1720 are applied to WLn+1, WLn and WLn−1, respectively. For each NAND string, the reads R1 and R2 classify the WLn+1 and WLn−1 memory cells, respectively, into one of two bins. For the selected memory cell of WLn, three reads R3-R5 occur to demarcate between the Er and A states while setting VWLn to VrA_low, VrA_med. and VrA_high, respectively, and while setting VWLn−1 and VWLn+1 to Vread_nom. For a given selected memory cell, one of the read results is selected based on the bin combination.

Three reads R6-R8 then occur to demarcate between the D and E states while setting VWLn to VrE_low, VrE_med. and VrE_high, respectively, and while setting VWLn−1 and VWLn+1 to Vread_nom. For a given selected memory cell, one of the read results is then selected based on the bin combination.

This is an example of reading the selected memory cell with compensation, where a control circuit is configured to: read the selected memory cell while applying different control gate voltages to the selected memory cell (e.g., VrA_low, VrA_med. and VrA_high), one read pass voltage to the first memory cell (e.g., Vread_nom.) and one read pass voltage (e.g., Vread_nom.) to the second memory cell, and selecting one read result based on the threshold voltage of the first memory cell and the threshold voltage of the second memory cell. That is, one read result is selected based on a bin combination of the selected memory cell, where the bin combination is based on the bin into which the threshold voltage of the first memory cell is classified and the bin into which the threshold voltage of the second memory cell is classified.

Figure 18:
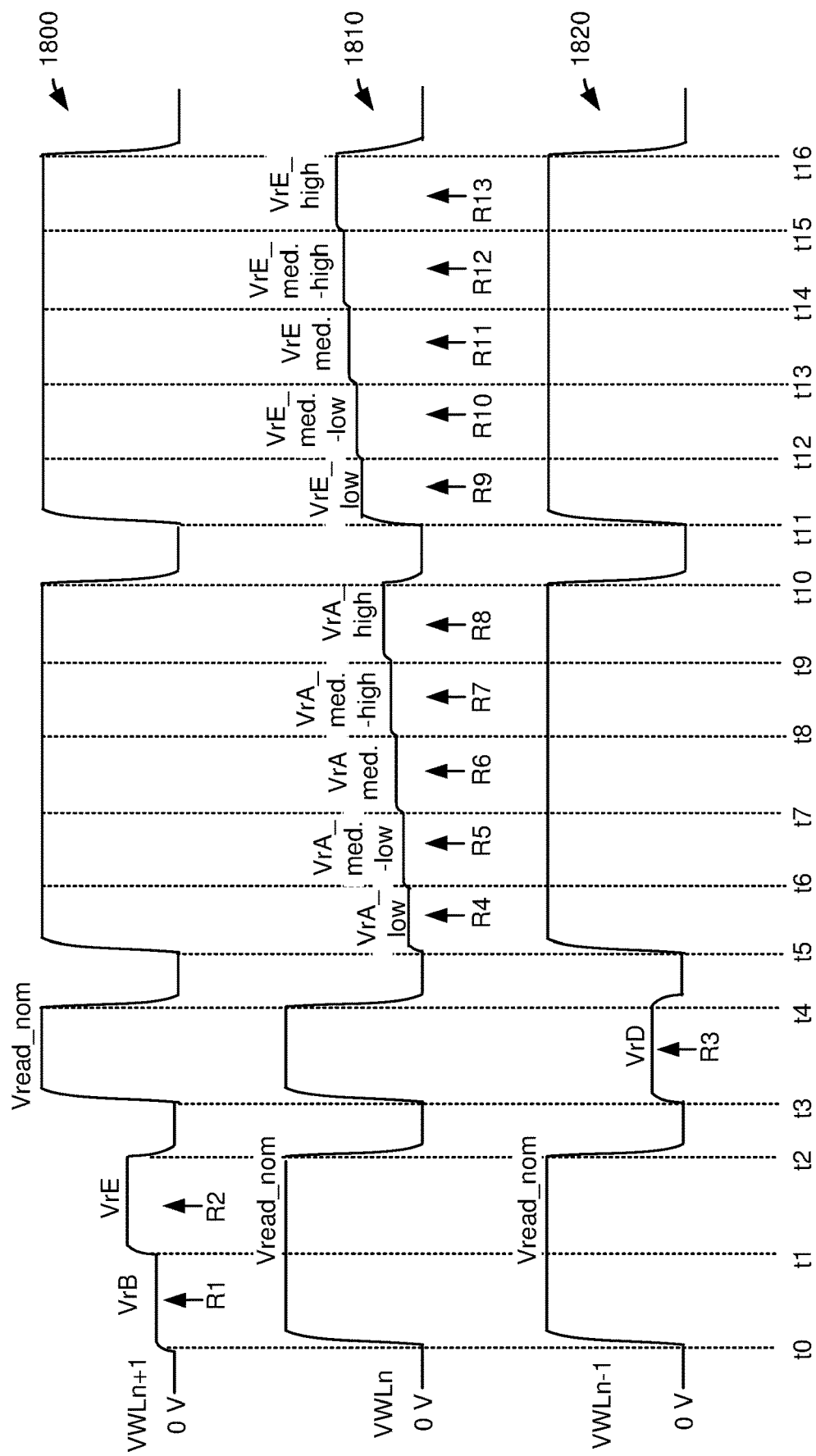
FIG. 18 depicts example word line voltages in an implementation of Example 6 of FIG. 12B.

FIG. 18 depicts example word line voltages in an implementation of Example 6 of FIG. 12B. Voltage signals 1800, 1810 and 1820 are applied to WLn+1, WLn and WLn−1, respectively. For each NAND string, the reads R1 and R2 classify the WLn+1 memory cell into one of three bins, and the read R3 classifies the WLn−1 memory cell into one of two bins.

For the selected memory cell of WLn, five reads R4-R8 occur to demarcate between the Er and A states while setting VWLn to VrA_low, VrA_med.-low, VrA_med., VrA_med.-high and VrA_high, respectively, and while setting VWLn−1 and VWLn+1 to Vread_nom. For a given selected memory cell, one of the read results is selected based on the bin combination.

Five reads R9-R13 then occur to demarcate between the D and E states while setting VWLn to VrE_low, VrE_med.-low, VrE_med., VrE_med.-high and VrE_high, respectively, and while setting VWLn−1 and VWLn+1 to Vread_nom. For a given selected memory cell, one of the read results is then selected based on the bin combination.

Figure 19:
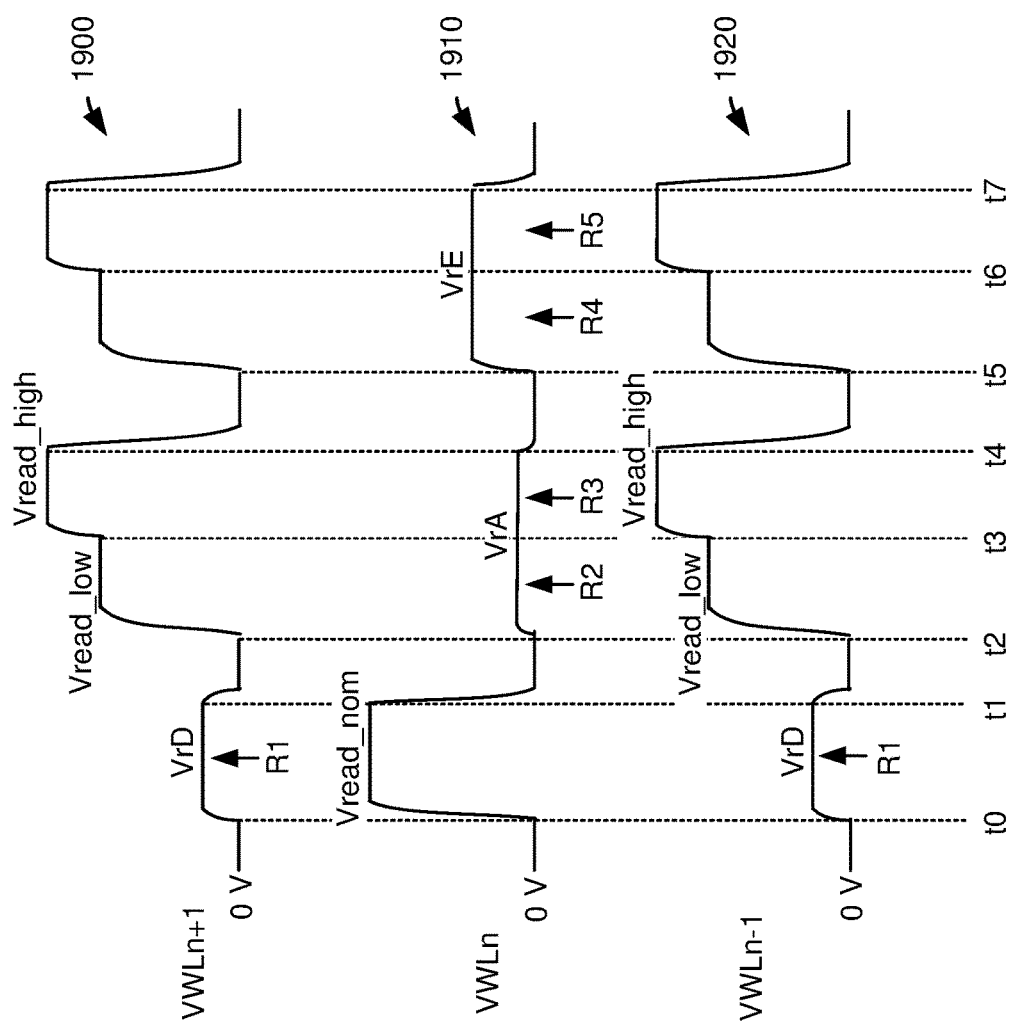
FIG. 19 depicts example word line voltages in an implementation of Example 12 of FIG. 12F.

FIG. 19 depicts example word line voltages in an implementation of Example 12 of FIG. 12F. Voltage signals 1900, 1910 and 1920 are applied to WLn+1, WLn and WLn−1, respectively. For each NAND string, the read R1 concurrently classifies the WLn+1 and WLn−1 memory cells together into one of two bins. For the selected memory cell of WLn, two reads demarcate between the Er and A states while VrA is applied to WLn. The read R2 occurs with a read compensation of Vread_low on WLn−1 and WLn+1, and the read R3 occurs with a read compensation of Vread_high on WLn−1 and WLn+1. For a given selected memory cell, one of the read results is selected based on the bin combination. Two reads R4 and R5 are then performed while VrE is applied to WLn to demarcate between the D and E states, with a similar read compensation as R2 and R3, respectively. For a given selected memory cell, one of the read results is then selected based on the bin combination.

In one embodiment, a control circuit is configured to concurrently read the threshold voltage of the first memory cell and the threshold voltage of the second memory cell, as depicted by the read R1.

In one implementation, an apparatus comprises: a NAND string comprising a selected memory cell, and first and second memory cells adjacent to and on opposing sides of the selected memory cell; and a control circuit configured to read the selected memory cell with compensation, the compensation compensates for a threshold voltage of the first memory cell and a threshold voltage of the second memory cell.

In another implementation, a method comprises: classifying a threshold voltage of a first memory cell in a NAND string; classifying a threshold voltage of a second memory cell in the NAND string; and reading a selected memory cell in the NAND string between, and adjacent to, the first memory cell and the second memory cell with compensation, the compensation is based on the classifying of the threshold voltage of the first memory cell and the classifying of the threshold voltage of a second memory cell.

In another implementation, an apparatus comprises: a NAND string comprising a selected memory cell, and first and second memory cells adjacent to and on opposing sides of the selected memory cell, the selected memory cell is connected to a selected word line; first means for classifying a threshold voltage of the first memory cell into a first number of bins when the selected word line is an edge or open word line; second means for classifying the threshold voltage of the first memory cell into a second number of bins which is less than the first number of bins when the selected word line is not the edge or open word line; first means for reading the selected memory cell with compensation based on the classifying of the threshold voltage of the first memory cell into the first number of bins when the selected word line is the edge or open word line; and second means for reading the selected memory cell with compensation based on the classifying of the threshold voltage of the first memory cell into the second number of bins when the selected word line is not the edge or open word line.

The first and second means for classifying, and the first and second means for reading, may include the controller 122, control circuitry 110, the power control module 116, and sense blocks 51-53 of FIG. 1-3, or other logic hardware, and/or other executable code stored on a computer readable storage medium or device. Other embodiments may include similar or equivalent means. The first and second means for classifying, and the first and second means for reading are also explained by the various flowcharts, tables and voltage signals provided herein.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a NAND string comprising a selected memory cell, and first and second memory cells adjacent to and on opposing sides of the selected memory cell; and
   a control circuit configured to read the selected memory cell with compensation, the compensation compensates for a threshold voltage of the first memory cell and a threshold voltage of the second memory cell.

2. The apparatus of claim 1, wherein to read the selected memory cell with the compensation, the control circuit is configured to:
   read the selected memory cell while applying a series of control gate voltages to the selected memory cell and different combinations of read pass voltages to the first and second memory cells during each control gate voltage of the series of control gate voltages, wherein the read pass voltages are set based on a decreasing function of the control gate voltages.

3. The apparatus of claim 1, wherein to read the selected memory cell with the compensation, the control circuit is configured to:
   read the selected memory cell while applying a control gate voltage to the selected memory cell and different combinations of read pass voltages to the first and second memory cells.

4. The apparatus of claim 1, wherein the control circuit is configured to:
   provide the compensation based on classifying the threshold voltage of the first memory cell into a number of bins, wherein the number of bins is an increasing function of temperature.

5. The apparatus of claim 1, wherein:
   the first memory cell is before the selected memory cell in a word line programming order;
   the second memory cell is after the selected memory cell in the word line programming order; and
   the control circuit is configured to provide the compensation based on classifying the first memory cell into a number of bins which is less than a number of bins into which the threshold voltage of the second memory cell is classified.

6. The apparatus of claim 1, wherein to read the selected memory cell with the compensation, the control circuit is configured to:

read the selected memory cell while applying different control gate voltages to the selected memory cell, one read pass voltage to the first memory cell and one read pass voltage to the second memory cell, and select one read result based on the threshold voltage of the first memory cell and the threshold voltage of the second memory cell.

7. The apparatus of claim 1, wherein:
the control circuit is configured to concurrently read the threshold voltage of the first memory cell and the threshold voltage of the second memory cell.

8. The apparatus of claim 1, wherein to read the selected memory cell with the compensation, the control circuit is configured to:
read the selected memory cell while applying a control gate voltage to the selected memory cell, one read pass voltage to the first memory cell and different read pass voltages to the second memory cell.

9. The apparatus of claim 1, wherein:
when the selected memory cell is not connected to an edge or open word line, the control circuit is configured to provide the compensation using a total of N latches to classify the threshold voltage of the first memory cell and the threshold voltage of the second memory cell, where N is a positive integer; and
when the selected memory cell is connected to the edge or open word line, the control circuit is configured to provide the compensation using the N latches to classify the threshold voltage of the first memory cell.

10. The apparatus of claim 1, wherein:
the control circuit is configured to provide the compensation based on classifying the threshold voltage of the first memory cell into bins and classifying of the threshold voltage of the second memory cell into bins, and provide a number of different levels of the compensation which is less than a number of the bins into which threshold voltage of the first memory cell is classified multiplied by a number of the bins into which threshold voltage of the second memory cell is classified.

11. The apparatus of claim 1, wherein:
the control circuit is configured to read the selected memory cell in response to a prior read operation involving the selected memory cell resulting in an uncorrectable error, the prior read operation compensates for the threshold voltage of the first memory cell but not for the threshold voltage of the second memory cell.

12. A method, comprising:
classifying a threshold voltage of a first memory cell in a NAND string;
classifying a threshold voltage of a second memory cell in the NAND string; and
reading a selected memory cell in the NAND string between, and adjacent to, the first memory cell and the second memory cell with compensation, the compensation is based on the classifying of the threshold voltage of the first memory cell and the classifying of the threshold voltage of a second memory cell.

13. The method of claim 12, wherein:
the compensation is based on a control gate read voltage of the selected memory cell.

14. The method of claim 13, wherein:
the compensation is lower when the control gate read voltage is higher.

15. The method of claim 12, wherein:
the reading with the compensation occurs in response to a prior read operation involving the selected memory cell resulting in an uncorrectable error, the prior read operation is not compensated based on the classifying of the threshold voltage of the first memory cell and the classifying of the threshold voltage of the second memory cell.

16. The method of claim 12, wherein:
the reading is performed in response to determining that a temperature is above a threshold temperature.

17. An apparatus, comprising:
a NAND string comprising a selected memory cell, and first and second memory cells adjacent to and on opposing sides of the selected memory cell, the selected memory cell is connected to a selected word line;
first means for classifying a threshold voltage of the first memory cell into a first number of bins when the selected word line is an edge or open word line;
second means for classifying the threshold voltage of the first memory cell into a second number of bins which is less than the first number of bins when the selected word line is not the edge or open word line;
first means for reading the selected memory cell with compensation based on the classifying of the threshold voltage of the first memory cell into the first number of bins when the selected word line is the edge or open word line; and
second means for reading the selected memory cell with compensation based on the classifying of the threshold voltage of the first memory cell into the second number of bins when the selected word line is not the edge or open word line.

18. The apparatus of claim 17, wherein:
the compensation of the first means is based on a predetermined threshold voltage of the second memory cell; and
the compensation of the second means is based on classifying the threshold voltage of the second memory cell.

19. The apparatus of claim 17, wherein:
the first means classifies the threshold voltage of the first memory cell into the first number of bins by reading the first memory cell using N1 read voltages; and
the second means classifies the threshold voltage of the first memory cell into the second number of bins by reading the first memory cell using N2 read voltages, where N2>N1 and N1 and N2 are positive integers.

20. The apparatus of claim 17, wherein:
the selected word line is the edge word line when the selected word line is a topmost or bottommost data word line in a block; and
the selected word line is the open word line when the selected word line is adjacent to an unprogrammed word line.

* * * * *